(12) United States Patent
Jinbo

(10) Patent No.: US 6,943,603 B2
(45) Date of Patent: Sep. 13, 2005

(54) PULSE GENERATING CIRCUIT AND SEMICONDUCTOR DEVICE PROVIDED WITH SAME

(75) Inventor: Toshikatsu Jinbo, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/651,970

(22) Filed: Sep. 2, 2003

(65) Prior Publication Data
US 2004/0041608 A1 Mar. 4, 2004

(30) Foreign Application Priority Data
Aug. 30, 2002 (JP) ...................... 2002-255930

(51) Int. Cl.[7] .............................. H03K 5/04
(52) U.S. Cl. .................. 327/171; 327/172; 327/173
(58) Field of Search ................ 327/171, 172, 327/173, 174, 175, 227, 228, 229, 178

(56) References Cited

U.S. PATENT DOCUMENTS

| | | | | |
|---|---|---|---|---|
| 4,207,539 A | * | 6/1980 | Minakuchi | 331/1 A |
| 5,057,702 A | * | 10/1991 | Kitagawa et al. | 327/175 |
| 5,821,721 A | * | 10/1998 | Boyd et al. | 318/685 |
| 6,121,812 A | * | 9/2000 | Tsukikawa | 327/280 |
| 6,278,638 B1 | | 8/2001 | Tomita et al. | 365/189.07 |
| 6,285,265 B1 | * | 9/2001 | Morita et al. | 333/12 |
| 6,407,951 B2 | | 6/2002 | Tomita et al. | 365/189.07 |
| 6,753,711 B2 | * | 6/2004 | McCollum et al. | 327/156 |
| 6,753,721 B2 | * | 6/2004 | Otsuka et al. | 327/540 |

FOREIGN PATENT DOCUMENTS

| | | |
|---|---|---|
| JP | 3-096112 | 4/1991 |
| JP | 2000-243096 | 9/2000 |

* cited by examiner

Primary Examiner—Tuan T. Lam
Assistant Examiner—Hiep Nguyen
(74) Attorney, Agent, or Firm—Foley & Lardner LLP

(57) ABSTRACT

A pulse generating circuit generates a pulse with a desired pulse width even when a process parameter for manufacturing fluctuates or a source voltage varies. The pulse generating circuit includes a first voltage outputting section having a first delay circuit and operating to output a first voltage changing from a high level towards a low level based on a first time constant according to a one-shot pulse, a second voltage outputting section having a second delay circuit and operating to output a second voltage changing from a low level towards a high level based on a second time constant according to the one-shot pulse, and a differential circuit to generate a pulse with a pulse width corresponding to a period from a time point of inputting the one-shot pulse to a cross time point when the first voltage coincides with the second voltage.

16 Claims, 18 Drawing Sheets

34; differential circuit

FIG. 27 (PRIOR ART)

| $V_{INV}(V)$ | | $C_1R_1$ (nsec) | | |
|---|---|---|---|---|
| | | 24 | 30 | 36 |
| 0.8 | $T_{11}$ | 14.11 | 17.63 | 21.16 (nsec) |
| 0.9 | $T_{12}$ | 16.64 | 20.79 | 24.95 (nsec) |
| 1.0 | $T_{13}$ | 19.46 | 24.32 | 29.19 (nsec) |

US 6,943,603 B2

1

PULSE GENERATING CIRCUIT AND SEMICONDUCTOR DEVICE PROVIDED WITH SAME

BACKGROUND OF THE INVENTION

1. Field of the Invention

The present invention relates to a pulse generating circuit to generate a pulse with a specified pulse width according to a one-shot pulse and to a semiconductor device provided with the same, and more particularly to the pulse generating circuit being suitably used for the pulse generation in the semiconductor devices such as an SRAM (Static Random Access Memory), DRAM (Dynamic Random Access Memory), PROM (Programmable Read-Only Memory), EPROM (Erasable Programmable ROM), EEPROM (Electrically Erasable Programmable ROM), flash memory, or a like and to the semiconductor device provided with the above pulse generating circuit.

The present application claims priority of Japanese Patent Application No. 2002-255930 filed on Aug. 30, 2002, which is hereby incorporated by reference.

2. Description of the Related Art

FIG. 22 is a circuit diagram showing configurations of a first conventional pulse generating circuit. The first conventional pulse generating circuit is a CR (Capacitance-Resistance) type pulse generator and includes inverters 1 and 2, a resistor 3, an n-channel MOS (Metal Oxide Semiconductor) transistor 4, and a capacitor 5. The inverters 1 and 2, as shown in FIG. 22, are of a CMOS (Complementary Metal Oxide Semiconductor) structure made up of a p-channel MOS transistor 6 (see FIG. 23) and an n-channel MOS transistor 7 (see FIG. 23). The inverter 1 inverts a one-shot pulse $P_{OS}$ with a specified pulse width fed from an outside and outputs the inverted pulse. The resistor 3 has a resistance value $R_1$, one terminal of which is connected to an output terminal of the inverter 1 and another terminal of which is connected to a node $N_A$. To a gate of the n-channel MOS transistor 4 is applied the one-shot pulse $P_{OS}$ and its drain is connected to the node $N_A$ and its source is connected to a ground. The capacitor 5 has a capacitance value $C_1$, one terminal of which is connected to the node $N_A$ and another terminal of which is connected to a ground. The inverter 2 inverts a pulse $P_A$ at the node $N_A$ and outputs the inverted pulse as an output pulse $P_{LS}$. The resistor 3 and capacitor 5 make up a delay circuit having a time constant $C_1R_1$.

Next, operations of the first conventional pulse generating circuit having the configurations described above are explained by referring to a waveform diagram shown in FIG. 24. First, in an initial state, when a "L" (low) level voltage is applied to an input terminal of the inverter 1 (see FIG. 24(1)), since the inverter 1 inverts the "L" level voltage, an output voltage from the inverter 1 becomes high. Similarly, when a "L" level voltage is applied to a gate of the n-channel MOS transistor 4 (see FIG. 24 (1)), the n-channel MOS transistor 4 is in an OFF state. As a result, a voltage $V_A$ at the node $N_A$, as shown in FIG. 24 (2), is at a "H" (high) level. This causes the inverter 2 to invert a voltage $V_A$ at the node $N_A$, that is, a "H" level voltage and, therefore, an output voltage from the inverter 2 becomes low (see FIG. 24 (3)). At this point, the capacitor 5 accumulates electric charges corresponding to its capacitance value $C_1$.

In such the initial state, as shown in FIG. 24 (1), when the one-shot pulse $P_{OS}$ whose voltage changes from a "L" level to a "H" level is fed to an input terminal of the inverter 1 at

2 time $t_0$, since the inverter 1 inverts a change in the voltage of the one-shot pulse $P_{OS}$ from a "L" level to a "H" level, an output voltage from the inverter 1 changes from a "H" level to a "L" level. Similarly, as shown in FIG. 24 (1), when the one-shot pulse $P_{OS}$ whose voltage changes from a "L" level to a "H" level is fed to the gate of the n-channel MOS transistor 4 at time $t_0$, the n-channel MOS transistor 4 changes from an OFF state to an ON state. As a result, the voltage $V_A$ at the node $N_A$, as shown in FIG. 24 (2), changes from a "H" level to a "L" level. This causes the inverter 2 to invert the voltage $V_A$ at the node $N_A$, that is, the change in the voltage of the one-shot pulse $P_{OS}$ from a "H" level to a "L" level and, therefore, an output voltage from the inverter 2 changes from a "L" level to a "H" level (see FIG. 24 (3)). At this point, electrical charges accumulated in the capacitor 5 in the initial state are discharged through the n-channel MOS transistor 4.

Next, as shown in FIG. 24 (1), when a voltage of the one-shot pulse $P_{OS}$ changes from a "H" level to a "L" Level at time $t_1$, since the inverter 1 inverts the change in the voltage of the one-shot pulse $P_{OS}$ from a "L" Level to a "H" level, an output voltage from the inverter 1 changes from a "L" Level to a "H" level. Similarly, as shown in FIG. 24 (1), when a voltage of the one-shot pulse $P_{OS}$ changes from a "H" level to a "L" Level, the n-channel MOS transistor 4 changes from an ON state to an OFF state. However, since a delay circuit made up of the resistor 3 and the capacitor 5 is connected to the node $N_A$, as shown in FIG. 24 (2), accumulation of electrical charges in the capacitor 5 starts from the time $t_1$ and the voltage $V_A$ at the node $N_A$ comes to be boosted according to a time constant $C_1R_1$ that is determined by a capacitance value $C_1$ of the capacitor 5 and the resistance value $R_1$ of the resistor 3. At this point, while the voltage $V_A$ at the node $N_A$ is lower than a logical threshold value $V_{INV}$ of the inverter 2, an output voltage from the inverter 2 remains at a "H" level (see FIG. 24 (3)).

Then, when the voltage $V_A$ at the node $N_A$ becomes higher than the above logical threshold value $V_{INV}$ due to proceeding of the accumulation of electrical charges in the capacitor 5, an output voltage from the inverter 2 changes from a "H" level to a "L" Level (see FIG. 24 (3)). As described above, the first conventional pulse generating circuit, when having received the one-shot pulse $P_{OS}$, as shown in FIG. 24 (1), generates the output pulse $P_{LS}$ with a specified pulse width, as shown in FIG. 24 (3), based on operations explained above. Moreover, another conventional pulse generating circuit having configurations being similar to those of the above first conventional pulse generating circuit is disclosed in Japanese Patent Application Laid-open No. Hei 03-96112 (see FIG. 1 of the same document).

Next, FIG. 25 is a circuit diagram showing configurations of a second conventional pulse generating circuit. The second conventional pulse generating circuit is an inverter-chain-type pulse generating circuit and is made up of inverters 8 to 14, n-channel MOS transistors 15 to 17, and p-channel MOS transistors 18 to 19. Each of the inverters 8 to 14, as in the case shown in FIG. 23, is of a CMOS structure made up of a p-channel MOS transistor and an n-channel MOS transistor. Each of the inverters 8 and 9 inverts a one-shot pulse $P_{OS}$ with a specified pulse width and outputs the inverted pulse. The inverter 10 inverts an output voltage from the inverter 9 and outputs the inverted voltage. The inverter 11 inverts an output voltage from the inverter 10 and outputs the inverted voltage. The inverter 12 inverts an output voltage from the inverter 11 and outputs the inverted voltage. Moreover, the inverter 13 inverts an output voltage from the inverter 12 and outputs the inverted voltage. The inverter 14 inverts an output voltage from the inverter 13 and outputs the inverted voltage. To a gate of the n-channel MOS transistor 15 is applied the one-shot pulse $P_{OS}$ and its drain is connected to an output terminal of the inverter 9 and its source is connected to a ground. To a gate of the n-channel MOS transistor 16 is applied the one-shot pulse $P_{OS}$ and its drain is connected to an output terminal of the inverter 11 and its source is connected to a ground. To a gate of the n-channel MOS transistor 17 is applied the one-shot pulse $P_{OS}$ and its drain is connected to an output terminal of the inverter 13 and its source is connected to a ground. Moreover, a gate of the p-channel MOS transistor 18 is connected to an output terminal of the inverter 8 and a source voltage $V_{CC}$ is applied to its source and its drain is connected to an output terminal of the inverter 10. A gate of the p-channel MOS transistor 19 is connected to an output terminal of the inverter 8 and a source voltage $V_{CC}$ is applied to its source and its drain is connected to an output terminal of the inverter 12.

Next, operations of the second conventional pulse generating circuit having configurations described above are described by referring to a waveform diagram shown in FIG. 26. First, in an initial state, while a "L" Level voltage is applied to a gate of each of the n-channel MOS transistors 15 to 17 (see FIG. 26 (1)), each of the MOS transistors is in an OFF state. Likewise, while a "L" Level voltage is applied to an input terminal of the inverter 8 (see FIG. 26 (1)), since the inverter 8 inverts the "L" level voltage, an output voltage from the inverter 8 becomes high. This causes a "H" level voltage to be applied to each of the p-channel MOS transistors 18 and 19 and, therefore, each of the p-channel MOS transistors 18 and 19 is put into an OFF state. As a result, while a "L" Level voltage is applied to an input terminal of the inverter 9 (see FIG. 26 (1)), since the inverter 9 inverts the "L" level voltage, the inverter 10 inverts an output voltage from the inverter 9, the inverter 11 inverts an output voltage from the inverter 10, the inverter 12 inverts an output voltage from the inverter 11, and the inverter 13 inverts an output voltage from the inverter 12, a voltage $V_A$ at a node $N_A$ is at a "H" level, as shown in FIG. 26 (2). This causes the inverter 14 to invert the voltage $V_A$ at the node $N_A$, that is, the "H" level voltage and, therefore, an output voltage from the inverter 14 becomes low (see FIG. 26 (3)).

In such the initial state, as shown in FIG. 26 (1), when a one-shot pulse $P_{OS}$ whose voltage changes from a "L" Level to a "H" level is applied to each of the n-channel MOS transistors 15 to 17 at time $t_0$, each of the n-channel MOS transistors 15 to 17 changes from an ON state to an OFF state. Similarly, as shown in FIG. 26 (1), when the one-shot pulse $P_{OS}$ whose voltage changes from a "L" Level to a "H" level is applied to an input terminal of the inverter 8 at the time $t_0$, since the inverter 8 inverts the change in the voltage of the one-shot pulse $P_{OS}$ from a "L" Level to a "H" level, an output voltage from the inverter 8 changes from a "H" level to a "L" Level. This causes each of the p-channel MOS transistors 18 and 19 to change from an OFF state to an ON state. Therefore, as shown in FIG. 26 (1), when the one-shot pulse $P_{OS}$ whose voltage changes from a "L" Level to a "H" level is applied to an input terminal of the inverter 9 at time $t_0$, an output voltage from the inverter 9 changes from a "H" level to a "L" Level, an output voltage from the inverter 10 changes from a "H" level to a "L" Level, an output voltage from the inverter 11 changes from a "H" level to a "L" Level, an output voltage from the inverter 12 changes from a "H" level to a "L" level, and an output voltage from the inverter 13 changes from a "H" level to a "L" level, the voltage $V_A$ at the node $N_A$, as shown in FIG. 26 (2), changes from a "H" level to a "L" Level. This causes the inverter 14 to invert the voltage $V_A$ at the node $N_A$, that is, the change in voltage from a "H" level to a "L" level, an output voltage from the inverter 14 changes from a "L" level to a "H" level (see FIG. 26 (3)).

Next, as shown in FIG. 26 (1), when a voltage of the one-shot pulse $P_{OS}$ changes from a "L" Level to a "H" level at time $t_1$, each of the n-channel MOS transistors 15 to 17 change from an ON state to an OFF state. Similarly, as shown in FIG. 26 (1), when a voltage of the one-shot pulse $P_{OS}$ changes from a "H" level to a "L" level at time $t_1$, since the inverter 8 inverts the change in the voltage of the one-shot pulse $P_{OS}$ from a "H" level to a "L" Level, an output voltage from the inverter 8 changes from a "L" level to a "H" level. This causes each of the p-channel MOS transistors 18 and 19 to change from an ON state to an OFF state. Therefore, as shown in FIG. 26 (1), when a voltage of the one-shot pulse $P_{OS}$ changes from a "H" level to a "L" level at time $t_1$, the inverter 9, according to changes in a voltage of the one-shot pulse $P_{OS}$ from a "H" level to a "L" level, changes its output voltage from a "L" level to a "H" level during time corresponding mainly to a current driving capability of the p-channel MOS transistor making up the inverter 9.

As a result, the inverter 10, when an output voltage from the inverter 9 changes from a "L" level to a "H" level and becomes higher than a logical threshold voltage of the inverter 10, changes its output voltage from a "H" level to a "L" Level during time corresponding mainly to a current driving capability of the n-channel MOS transistor making up the inverter 10. Then, the inverter 11, when an output voltage from the inverter 10 changes from a "H" level to a "L" Level and becomes lower than a logical threshold voltage of the inverter 11, changes its output voltage from a "L" Level to a "H" level during time corresponding mainly to a current driving capability of the p-channel MOS transistor making up the inverter 11. As a result, the inverter 12, when an output voltage from the inverter 11 changes from a "L" Level toward a "H" level and becomes higher than a logical threshold voltage of the inverter 12, changes its output voltage from a "H" level to a "L" Level during time corresponding mainly to a current driving capability of the n-channel MOS transistor making up the inverter 12. Then, the inverter 13, when an output voltage from the inverter 11 changes from a "H" level to a "L" Level and becomes lower than a logical threshold voltage of the inverter 13, changes its output voltage from a "L" Level to a "H" level during time corresponding mainly to a current driving capability of the p-channel MOS transistor making up the inverter 13. Therefore, the voltage $V_A$ at the node $N_A$, as shown in FIG. 26 (2), changes from a "L" Level to a "H" level after specified time has elapsed since the time $t_1$. Then, the inverter 14, when the voltage $V_A$ at the node $N_A$ changes from a "L" Level toward a "H" level and becomes higher than a logical threshold voltage of the inverter 14, changes its output voltage from a "H" level to a "L" Level during time corresponding mainly to a current driving capability of the p-channel MOS transistor making up the inverter 14 (see FIG. 26 (3). As described above, the second conventional pulse generating circuit, when having received the one-shot pulse $P_{OS}$ shown in FIG. 26 (1), generates an output pulse $P_{LS}$ with a specified pulse width shown in FIG. 26 (3) based on operations described above. Moreover, another conventional pulse generating circuit having configurations being similar to those of the above second conventional pulse generating circuit is disclosed in Japanese Patent Application Laid-open No. 2000-243096 (see FIG. 14 of the same document).

As explained above, in the first conventional pulse generating circuit, since the inverter 2 is placed in a back stage of the node $N_A$, when a process parameter fluctuates at time of manufacturing semiconductor devices being equipped with the conventional pulse generating circuit, especially when a threshold value of the MOS transistor fluctuates, a logical threshold value $V_{INV}$ of the inverter 2 is made to be varied. This produces a disadvantage in that fluctuation occurs in a pulse width of the output pulse $P_{LS}$ generated by the conventional pulse generating circuit being affected adversely by changes in the logical threshold value of the MOS transistor. Reasons for that are described below.

First, the logical threshold value $V_{INV}$ of the inverter 2 is represented by a following equation:

$$V_{INV} = (V_{CC} + V_{thp} + V_{thn} \cdot \sqrt{(\beta_n/\beta_p)})/(1 + \sqrt{(\beta_n/\beta_p)}) \quad \text{Equation (1)}$$

where $V_{CC}$ denotes a source voltage, $V_{thp}$ denotes a threshold value of a p-channel MOS transistor making up the inverter 2, $V_{thn}$ denotes a threshold value of an n-channel MOS transistor making up the inverter 2, $\beta_n$ denotes a gain constant of an n-channel MOS transistor making up the inverter 2, and $\beta_p$ denotes a gain constant of a p-channel MOS transistor making up the inverter 2.

Now let it be assumed that the source voltage $V_{CC}$ is 1.8V, the gain constant $\beta_n$ is equal to the gain constant $\beta_p$ and that ranges of variations in the threshold values $V_{thp}$ and $V_{thn}$ are represented by following equations (2) and (3) respectively:

$$V_{thp} = -0.6 \pm 0.1 \text{ V} \quad \text{Equation (2)}$$

$$V_{thn} = 0.6 \pm 0.1 \text{ V} \quad \text{Equation (3)}$$

In this case, the range of variations in the logical threshold value $V_{INV}$ of the inverter 2 is represented by following equations (4) to (6) by using the equation (1):

$$V_{INV1} = (1.8 + (-0.7) + 0.5 \cdot \sqrt{1})/(1 + \sqrt{1}) = 0.8 \text{ V} \quad \text{Equation (4)}$$

$$V_{INV2} = (1.8 + (-0.6) + 0.6 \cdot \sqrt{1})/(1 + \sqrt{1}) = 0.9 \text{ V} \quad \text{Equation (5)}$$

$$V_{INV3} = (1.8 + (-0.5) + 0.7 \cdot \sqrt{1})/(1 + \sqrt{1}) = 1.0 \text{ V} \quad \text{Equation (6)}$$

where $V_{INV1}$ denotes a minimum value that can be obtained when the threshold value $V_{thp}$ is −0.7 V, the threshold value $V_{thn}$ is 0.5 V and $V_{INV2}$ denotes a typical value that can be obtained when the threshold value $V_{thp}$ is −0.6 V and the threshold value $V_{thn}$ is 0.6 V and $V_{INV3}$ denotes a maximum value that can be obtained when the threshold value $V_{thp}$ is −0.5 V and the threshold value $V_{thn}$ is 0.7 V. These logical threshold values $V_{INV1}$ to $V_{INV3}$ are shown in FIG. 24 (2).

On the other hand, the delay circuit made up of the resistor 3 and the capacitor 5 has a primary delay characteristic and, therefore, time "t" required for the voltage $V_A$ at the node $N_A$ to reach the logical threshold value $V_{INV}$ of the inverter 2 from its ground level voltage at the time $t_1$ (time point when changes start) shown in FIG. 24 (2) is given by a following equation (7):

$$t = -C_1 R_1 \cdot \ln(1 - V_{INV}/V_{CC}) \quad \text{Equation (7)}$$

where $R_1$ denotes a resistance value of the resistor 3, $C_1$ denotes a capacity value of the capacitor 5, $V_{CC}$ denotes a source voltage, and $V_{INV}$ denotes a logical threshold value of the inverter 2. Here, if the resistance value $R_1$ of the resistor 3 is 30 kΩ, the capacity value $C_1$ of the capacitor 5 is 1 pF, that is, a time constant $C_1 R_1$ is 30 nsec, and the source voltage $V_{CC}$ is 1.8 V, time $T_{11}$ required for the voltage $V_A$ at the node $N_A$ to reach the logical threshold value $V_{INV1}$ (=0.8 V), time $T_{12}$ required for the voltage $V_A$ at the node $N_A$ to reach the logical threshold value $V_{INV2}$ (=0.9 V), and time $T_{13}$ required for the voltage $V_A$ at the node $N_A$ to reach the logical threshold value $V_{INV3}$ (=1.0 V) can be represented by following equations (8) to (10) using the equation (7):

$$T_{11} = -30 \cdot \ln(1 - 0.8/1.8) = 17.63 \text{ nsec} \quad \text{Equation (8)}$$

$$T_{12} = -30 \cdot \ln(1 - 0.9/1.8) = 20.79 \text{ nsec} \quad \text{Equation (9)}$$

$$T_{13} = -30 \cdot \ln(1 - 1.0/1.8) = 24.33 \text{ nsec} \quad \text{Equation (10)}$$

As is understood from FIG. 26 (3), these times $T_{11}$ to $T_{13}$ become pulse widths of the output pulse $P_{LS}$ as they are. Therefore, in the first conventional pulse generating circuit, if a logical threshold value $V_{INV}$ of the inverter 2 varies about 10% (0.9±0.1 V), a pulse width of the output pulse $P_{LS}$ varies about 17% where the pulse width is shorter and about 15% where it is longer.

Moreover, in the first conventional pulse generating circuit described above, there are some cases in which variations occurred in the resistance value $R_1$ of the resistor 3 and/or the capacitance value $C_1$ of the capacitor 5 are added to variations in the logical threshold value $V_{INV}$ of the inverter 2, which causes occurrence of large variations in the pulse width of the output pulse $P_{LS}$. FIG. 27 shows times $T_{11}$, $T_{12}$, and $T_{13}$ (see FIG. 24) required for a voltage $V_A$ at the node $N_A$ to reach each of the logical threshold values after accumulation of electric charges in the capacitor 5 has started when the source voltage $V_{CC}$ is 1.8 V and the time constant $C_1 R_1$ of the delay circuit varies 20% (30±6 nsec) and the logical threshold value $V_{INV}$ of the inverter 2 varies about 10% (0.9±0.1 V). As shown in FIG. 27, in the first conventional pulse generating circuit, a pulse width of an output pulse $P_{LS}$ varies in a range of 14.11 nsec to 29.19 nsec (range of variations: 15.08 nsec).

On the other hand, the second conventional pulse generating circuit has a disadvantage in that, since its delay circuit is constructed using an inverter chain, if a source voltage $V_{CC}$ varies during operations, a current driving capability of the MOS transistor making up the inverter is changed greatly, which causes changes in a speed of an inverted output from each of the inverters and great changes in the pulse width of the output pulse $P_{LS}$. Reasons for this are described below.

First, a current driving capability of an n-channel MOS transistor making up each of the inverters can be represented by following equations (11) and (12):

$$ID_{Sn} = \beta_n \cdot ((V_{Gn} - V_{thn})^2/2) \quad \text{Equation (11)}$$

$$ID_{Tn} = \beta_n \cdot ((V_{Gn} - V_{thn}) \cdot V_{Dn} - V_{Dn}^2/2) \quad \text{Equation (12)}$$

where $ID_{Sn}$ denotes a drain current in a saturation region, $ID_{Tn}$ denotes a drain current in a triode region (non-saturation region), $\beta_n$ denotes a gain constant of the n-channel MOS transistor, $V_{Gn}$ denotes a gate voltage of the n-channel MOS transistor, $V_{thn}$ denotes a threshold value of the n-channel transistor, and $V_{Dn}$ denotes a drain voltage of the n-channel MOS transistor.

Now, let it be assumed that the threshold value $V_{thn}$ of the n-channel MOS transistor is 0.6 V, the source voltage $V_{CC}$ is equal to the gate voltage $V_{Gn}$. Then, a range of variations in the source voltage $V_{CC}$ is given by a following equation:

$$V_{CC} = V_G = 1.8 \pm 0.2 \text{ V} \quad \text{Equation (13)}$$

A range of variations in the current driving capability in the saturation region in the state as described above can be represented by following equations (14), (15), and (16):

$$ID_{Sn1} = 0.98\beta_n \quad \text{Equation (14)}$$

$$ID_{Sn2} = 0.72\beta_n \quad \text{Equation (15)}$$

$$ID_{Sn3} = 0.50\beta_n \quad \text{Equation (16)}$$

where $ID_{Sn1}$ denotes a maximum value occurring when the source voltage $V_{CC}$ is 2.0 V (=$V_{CC1}$), $ID_{Sn2}$ denotes a typical value obtained when the source voltage $V_{CC}$ is 1.8 V (=$V_{CC2}$), and $ID_{Sn3}$ denotes a minimum value occurring when the source voltage $V_{CC}$ is 1.6 V (=$V_{CC3}$). Therefore, in the second conventional pulse generating circuit, if the source voltage $V_{CC}$ varies about 11% (1.8±0.2 V), the current driving capability in the saturation region of the n-channel MOS transistor varies about 36% where the capability is larger and about 30% where it is smaller.

On the other hand, variations in the current driving capability in the triode region depends on a drain voltage $V_D$. Now, let it be again assumed that $V_D = V_{CC}/2$, a threshold value $V_{thn}$ of the n-channel MOS transistor is 0.6 V, the source voltage $V_{CC}$ is equal to the gate voltage $V_{Gn}$. Then, a range of variations in the source voltage $V_{CC}$ is given by the above equation (13). A range of variations in the current driving capability in the saturation region in the state as described above can be represented by following equations (17), (18), and (19):

$$ID_{Tn1} = 0.900\beta_n \quad \text{Equation (17)}$$

$$ID_{Tn2} = 0.675\beta_n \quad \text{Equation (18)}$$

$$ID_{Tn3} = 0.480\beta_n \quad \text{Equation (19)}$$

where $ID_{Tn1}$ denotes a maximum value occurring when the source voltage $V_{CC}$ is 2.0 V (=$V_{CC1}$), $ID_{Tn2}$ denotes a typical value obtained when the source voltage $V_{CC}$ is 1.8 V (=$V_{CC2}$), and $ID_{Tn3}$ denotes a minimum value occurring when the source voltage $V_{CC}$ is 1.6 V (=$V_{CC3}$). Therefore, in the second conventional pulse generating circuit, if the source voltage $V_{CC}$ varies about 11% (1.8±0.2 V), the current driving capability in the triode region of the n-channel MOS transistor varies about 33% where the capability is larger and about 29% where it is smaller. As a result, an average variation in the current driving capability in the saturation region and triode region of the n-channel MOS transistor is about 34.5% where the capability is larger and about 29.5% where it is smaller. The variations in the current driving capability described above occur also in a p-channel MOS transistor in the same manner as explained above.

As a result, when an inverter chain type pulse generating circuit that provides delay time of about 10 nsec is constructed of a MOS transistor having a design rule of 0.2 μm and a source voltage $V_{CC}$ being 1.8 V, a pulse width varies in a manner as described below. Here, it is presumed that a threshold value $V_{thn}$ of the n-channel MOS transistor is 0.6 V and a threshold value $V_{thp}$ of the p-channel MOS transistor is -0.6 V. That is, a pulse width $T_{21}$ to be obtained when a source voltage $V_{CC}$ is 2.0 V (=$V_{CC1}$) is about 14.2 nsec, a pulse width $T_{22}$ to be obtained when the source voltage $V_{CC}$ is 1.8 V (=$V_{CC2}$) is about 11.2 nsec, and a pulse width $T_{23}$ to be obtained when the source voltage V is 1.6 V (=$V_{CC3}$) is about 9.4 nsec. These pulse widths $T_{21}$ to $T_{23}$ are represented in FIG. 26 (3). Therefore, in the second conventional pulse generating circuit, if the source voltage $V_{CC}$ varies about 11% (1.8±0.2 V), a pulse width of an output pulse $P_{LS}$ varies about 16% where the pulse width is shorter and about 27% where it is longer, in some cases.

SUMMARY OF THE INVENTION

In view of the above, it is an object of the present invention to provide a pulse generating circuit which is capable of generating a pulse with a desired pulse width even when a process parameter employed at time of manufacturing, especially a threshold voltage value of a MOS transistor fluctuates and/or even when a source voltage varies at time of operations, and to provide a semiconductor device provided with the above pulse generating circuit.

According to a first aspect of the present invention, there is provided a pulse generating circuit including:

a first voltage outputting section having a first delay circuit made up of a first resistor and a first capacitor and operating to output a first output voltage that changes from a first voltage towards a second voltage based on a first time constant according to a one-shot pulse;

a second voltage outputting section having a second delay circuit made up of a second resistor and a second capacitor and operating to output a second output voltage that changes from the second voltage towards the first voltage based on a second time constant according to the one-shot pulse; and a differential circuit to generate a pulse with a pulse width corresponding to a period from a time point of inputting the one-shot pulse to a cross time point when the first output voltage coincides with the second output voltage.

According to a second aspect of the present invention, there is provided a semiconductor device provided with a pulse generating circuit including:

a first voltage outputting section having a first delay circuit made up of a first resistor and a first capacitor and operating to output a first output voltage that changes from a first voltage towards a second voltage based on a first time constant according to a one-shot pulse;

a second voltage outputting section having a second delay circuit made up of a second resistor and a second capacitor and operating to output a second output voltage that changes from the second voltage towards the first voltage based on a second time constant according to the one-shot pulse; and a differential circuit to generate a pulse with a pulse width corresponding to a period from a time point of inputting the one-shot pulse to a cross time point when the first output voltage coincides with the second output voltage.

In the foregoing first and second aspects, a preferable mode is one wherein the differential circuit includes an input stage which is made up of a first conductive type of MOS transistors and a current mirror circuit which is made up of a second conductive type of MOS transistors.

Another preferable mode is one wherein threshold voltages of the first conductive type of MOS transistors are set to be equal to each other.

Still another preferable mode is one wherein the first conductive type of MOS transistors include n-channel MOS transistors, and a threshold voltage of each of the n-channel MOS transistors is 0 (zero) V or more and a cross-point voltage level or less, the cross-point voltage level being defined as a level of the first output voltage and the second output voltage at the cross time point.

An additional preferable mode is one wherein the first conductive type of MOS transistors include p-channel MOS transistors, and an absolute value of a threshold voltage of each of the p-channel MOS transistors is a cross-point voltage level or more, and a level of a source voltage or less, the cross-point voltage level being defined as a level of the first output voltage and the second output voltage at the cross time point.

A further preferable mode is one wherein the one-shot pulse is active high.

A still further preferable mode is one wherein the one-shot pulse is active low.

An additional preferable mode is one wherein the first time constant is equal to the second time constant.

With the above configurations, the pulse generating circuit of the present invention can generate a pulse with a desired pulse width even when a process parameter for manufacturing, especially a threshold voltage of a MOS transistor fluctuates or even when a source voltage varies during operations, by operating a first voltage outputting section having a first delay circuit made up of a first resistor and a first capacitor and operating to output a first output voltage that changes from a first voltage level towards a second voltage level based on a first time constant according to a one-shot pulse, a second voltage outputting section having a second delay circuit made up of a second resistor and a second capacitor and operating to output a second output voltage that changes from a second voltage level towards a first voltage level based on a second time constant according to the one-shot pulse, and a differential circuit to generate a pulse with a pulse width corresponding to a period from a time point of inputting the one-shot pulse to a cross time point when the first output voltage coincides with the second output voltage.

BRIEF DESCRIPTION OF THE DRAWINGS

The above and other objects, advantages, and features of the present invention will be more apparent from the following description taken in conjunction with the accompanying drawings in which:

FIG. 27 is a diagram explaining influences caused by variations of each of time constants of a delay circuit and a logical threshold value of an inverter in the conventional pulse generating circuit as the first conventional example.

DETAILED DESCRIPTION OF THE PREFERRED EMBODIMENTS

Best modes of carrying out the present invention will be described in further detail using various embodiments with reference to the accompanying drawings.

First Embodiment

Figure 1:
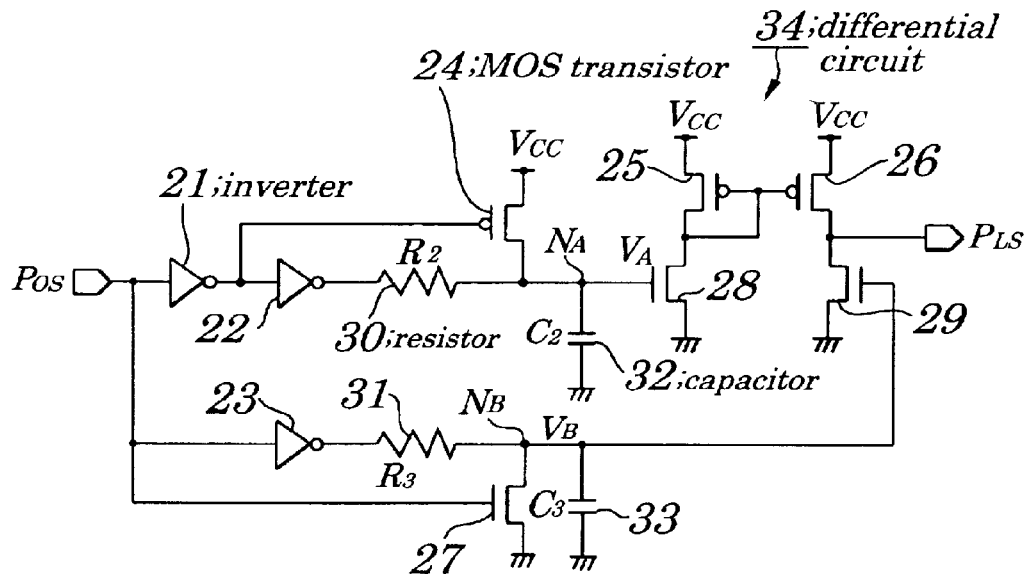
FIG. 1 is a circuit diagram showing configurations of a pulse generating circuit according to a first embodiment of the present invention.
Figure 23:
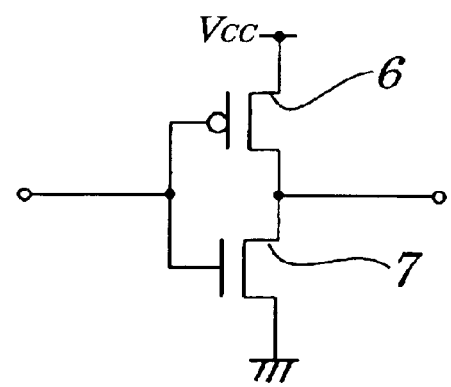
FIG. 23 is a circuit diagram showing an example of configurations of inverters making up the conventional pulse generating circuit as the first conventional example.
Figure 24:
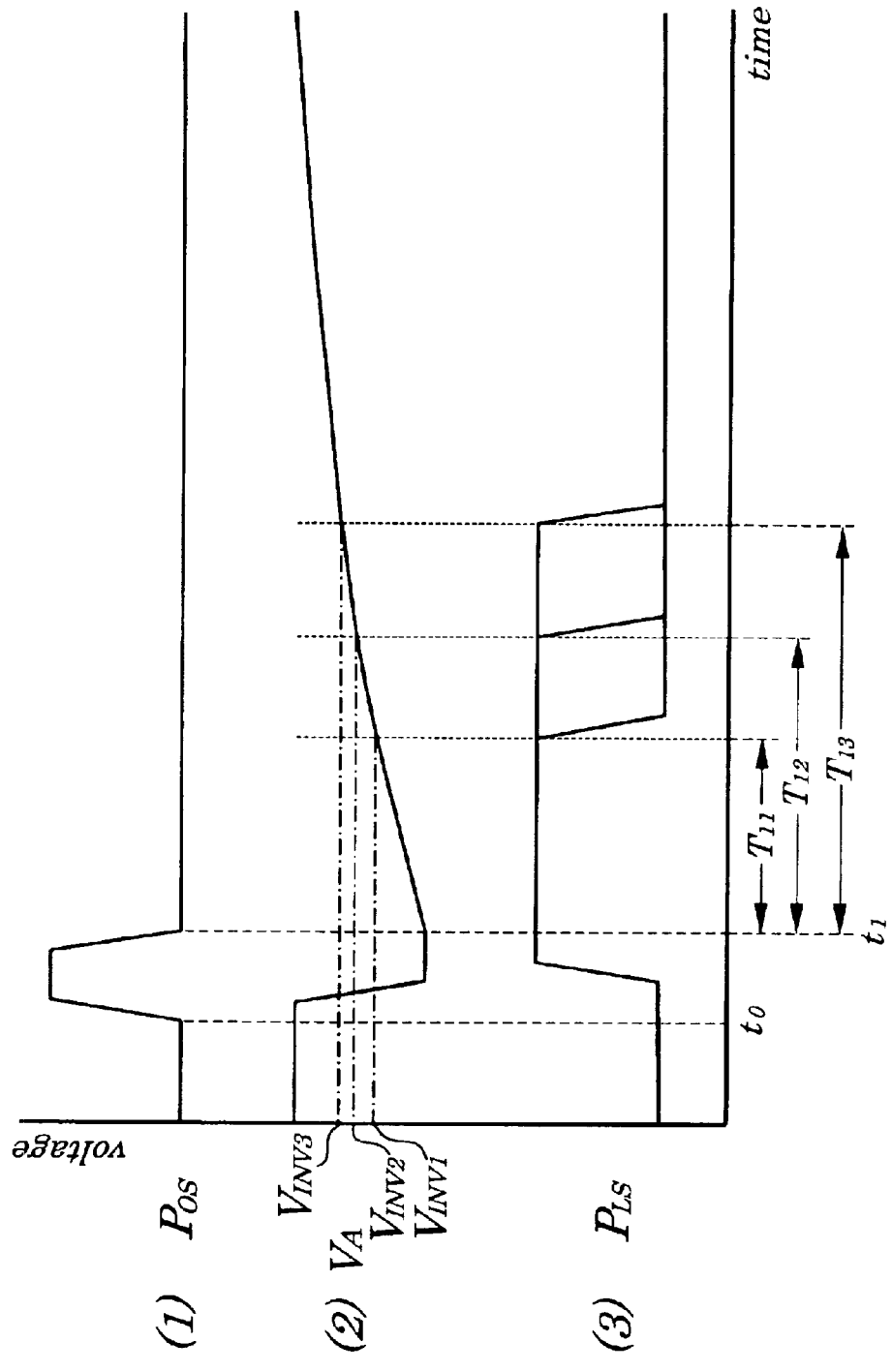
FIG. 24 is a waveform diagram explaining operations of the conventional pulse generating circuit as the first conventional example.
Figure 25:
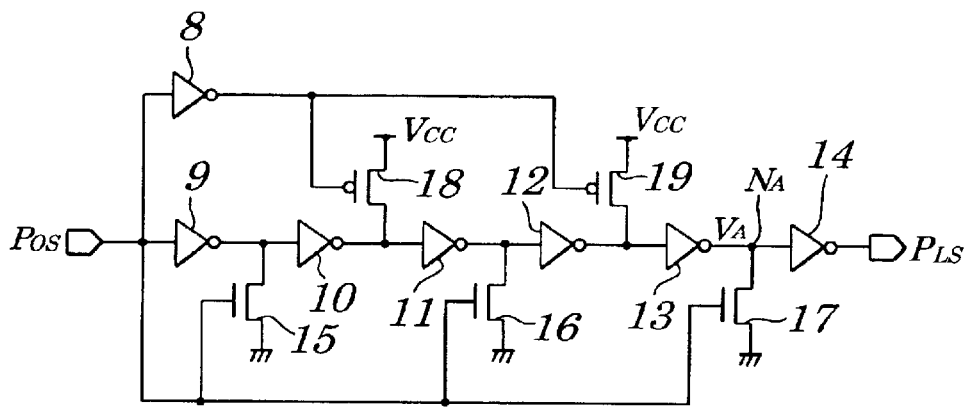
FIG. 25 is a circuit diagram for showing configurations of another conventional pulse generating circuit as a second conventional example.
Figure 26:
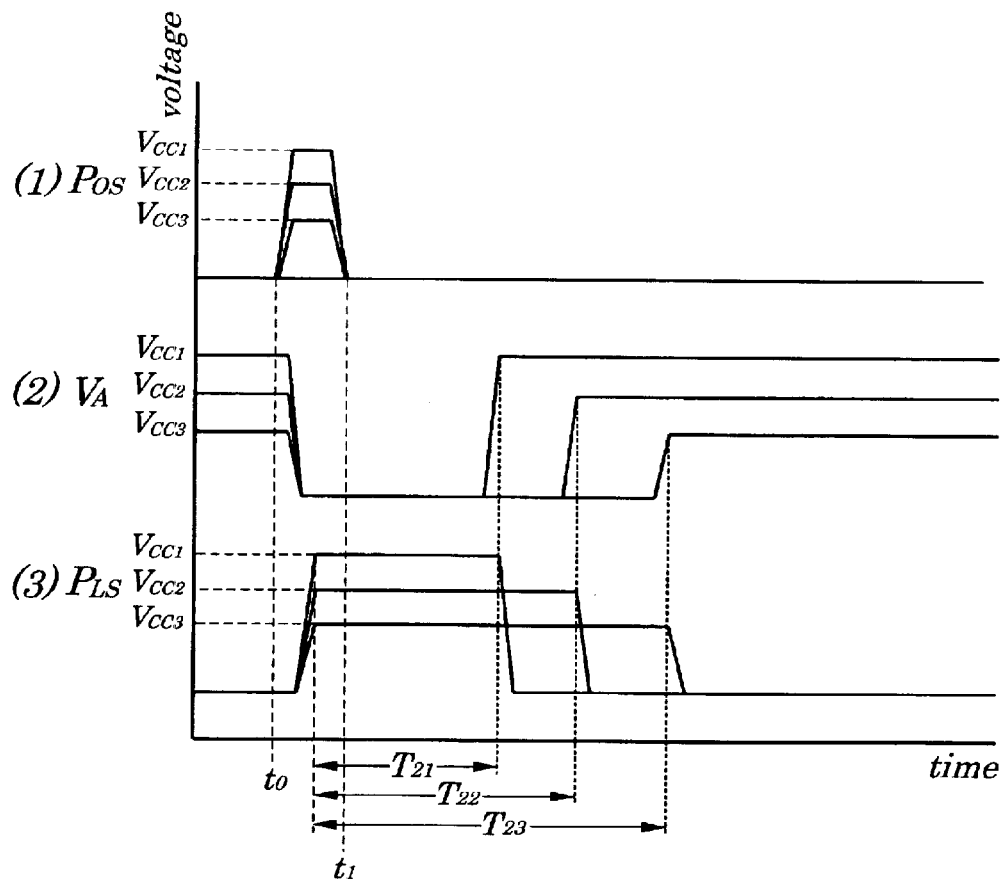
FIG. 26 is a waveform diagram explaining operations of the other conventional pulse generating circuit as the second conventional example.

FIG. 1 is a circuit diagram showing configurations of a pulse generating circuit according to a first embodiment of the present invention. The pulse generating circuit of the first embodiment includes inverters 21 to 23, p-channel MOS transistors 24 to 26, n-channel MOS transistors 27 to 29, resistors 30 and 31, and capacitors 32 to 33. Each of the inverters 21 to 23 is of a same CMOS structure as shown in FIG. 23, which is made up of a p-channel MOS transistor 6 and of an n-channel MOS transistor 7. The inverter 21 inverts a one-shot pulse with a specified pulse width fed from an outside and outputs the inverted pulse. The inverter 22 inverts a voltage output from the inverter 21 and outputs the inverted voltage. The resistor 30 has a resistance value $R_2$, one terminal of which is connected to an output terminal of the inverter 22 and another terminal of which is connected to a node $N_A$. The capacitor 32 has a capacitance value $C_2$, one terminal of which is connected to the node $N_A$ and another of which is connected to a ground. The resistor 30 and the capacitor 32 make up a first delay circuit having a time constant $C_2R_2$. A gate of the p-channel MOS transistor 24 is connected to an output terminal of the inverter 21 and a source voltage $V_{CC}$ is applied to its source and its drain is connected to the node $N_A$. The inverters 21 and 22, the p-channel MOS transistor 24, the resistor 30, and the capacitor 32 make up a first voltage outputting section.

On the other hand, the inverter 23 inverts a one-shot pulse $P_{OS}$ with a specified pulse width fed from an outside and outputs the inverted pulse. The resistor 31 has a resistance value $R_3$, one terminal of which is connected to an output terminal of the inverter 23 and another terminal of which is connected to a node $N_B$. The capacitor 33 has a capacitance value $C_3$, one terminal of which is connected to the node $N_B$ and another terminal of which is connected to a ground. The resistor 31 and the capacitor 33 make up a second delay circuit having a time constant $C_3R_3$. To a gate of the n-channel MOS transistor 27 is applied a one-shot pulse $P_{OS}$ and its drain is connected to the node $N_B$ and its source is connected to a ground. The inverter 23, the n-channel MOS transistor 27, the resistor 31, and the capacitor 33 make up a second voltage outputting section.

Moreover, each of the inverters 22 and 23, in order to prevent modulation in a pulse width of an output pulse $P_{LS}$ from being affected by rounding of a waveform of the one-shot pulse $P_{OS}$, has a function of performing waveform shaping on the one-shot pulse $P_{OS}$. To achieve this, an on-resistance value of the MOS transistors making up each of the inverters 22 and 23 has to be set so as to be sufficiently smaller than the resistance value $R_2$ of the resistor 30 or the resistance value $R_3$ of the resistor 31. Moreover, if each of the inverters 22 and 23 has enough current driving capability to drive each of the first and second delay circuits corresponding to each of the inverters 22 and 23, a pulse width of the output pulse $P_{LS}$ is not affected by variations in a logical threshold value $V_{INV}$ of each of the inverters 22 and 23.

Moreover, in the n-channel MOS transistor 28, a gate thereof is connected to the node $N_A$, a drain thereof is connected to a drain of the p-channel MOS transistor 25, and a source thereof is connected to a ground. In the p-channel MOS transistor 25, a source voltage $V_{CC}$ is applied to a source thereof and a gate thereof and a drain thereof are connected to each other and further the gate thereof is connected to a gate of the p-channel MOS transistor 26. A gate of the n-channel MOS transistor 29 is connected to the node $N_B$ and its drain is connected to a drain of the p-channel MOS transistor 26 and its source is connected to a ground. To a source of the p-channel MOS transistor 26 is applied the source voltage $V_{CC}$ and from its drain is output an output pulse $P_{LS}$. The p-channel MOS transistors 25 and 26, the n-channel MOS transistors 28 and 29 make up a differential circuit 34. Out of them, the p-channel MOS transistors 25 and 26 make up a current mirror circuit. Also, threshold voltages $V_{thn}$ of the n-channel MOS transistors 28 and 29 are set to be equal to each other.

Figure 2:
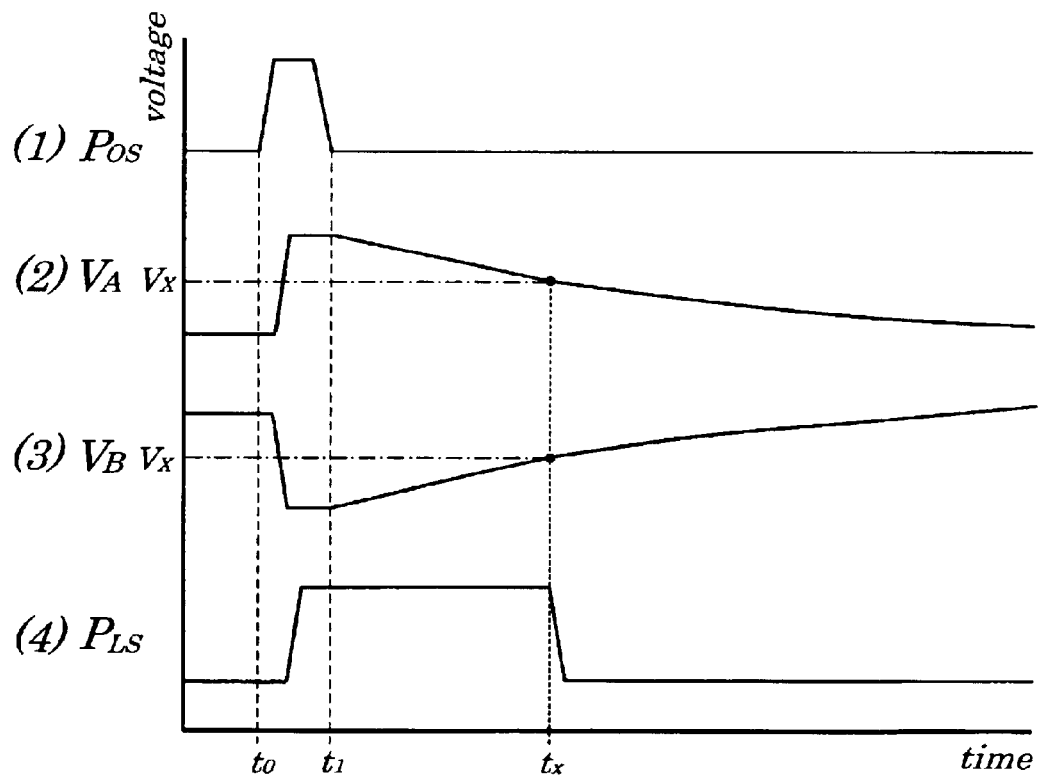
FIG. 2 is a waveform diagram explaining operations of the pulse generating circuit of the first embodiment of the present invention.

Next, operations of the pulse generating circuit having configurations described above are described by referring to a waveform diagram shown in FIG. 2. First, in an initial state, when a "L" Level voltage is applied to an input terminal of the inverter 21 (see FIG. 2 (1)), since the inverter 21 inverts the "L" level voltage, an output voltage from the inverter 21 becomes high. This causes a "H" level voltage to be applied to an input terminal of the inverter 22 and, therefore, the inverter 22 inverts the "H" level voltage and an output voltage from the inverter 22 becomes a "L" level. Moreover, since the "H" level voltage is applied to a gate of the p-channel MOS transistor 24, the p-channel MOS transistor 24 is put into an OFF state. As a result, a voltage $V_A$ at the node $N_A$ is at a "L" level, as shown in FIG. 2 (2).

On the other hand, when a "L" level voltage is applied to an input terminal of the inverter 23 (see FIG. 2(1)), since the inverter 23 inverts the "L" level voltage, an output voltage from the inverter 23 becomes "H" level. Similarly, while a "L" Level voltage is applied to a gate of the n-channel MOS transistor 27 (see FIG. 2 (1)), the n-channel MOS transistor 27 is in an OFF state. As a result, a voltage $V_B$ at the node $N_B$ is at a "H" level, as shown in FIG. 2 (3). At this point, electrical charges corresponding to a capacitance value $C_3$ have been accumulated in the capacitor 33. Therefore, to a gate of the n-channel MOS transistor 28 making up the differential circuit 34 is applied a "L" Level voltage and to a gate of the n-channel MOS transistor 29 making up the differential circuit 34 is applied a "H" level voltage. As a result, since the n-channel MOS transistor 28 is put into an OFF state and the n-channel MOS transistor 29 is put into an ON state, as shown in FIG. 2 (4), the differential circuit 34 outputs a "L" Level voltage.

Figure 3:
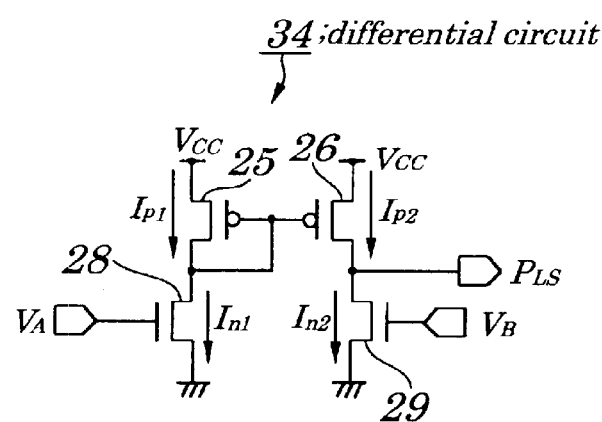
FIG. 3 is a circuit diagram explaining configurations and operations of a differential circuit making up the pulse generating circuit of the first embodiment of the present invention.

Next, operations of the differential circuit 34 are explained by referring to FIG. 3. In the differential circuit 34, as shown in FIG. 3, since the n-channel MOS transistor 28 is connected in series to the p-channel MOS transistor 25, depending on a level of the voltage $V_A$ at the node $N_A$ to be applied to a gate of the n-channel MOS transistor 28, a drain current $I_{n1}$ flowing through the n-channel MOS transistor 28 becomes equal to a drain current $I_{P1}$ flowing through the p-channel MOS transistor 25. Moreover, as described above, since the p-channel MOS transistor 25 and p-channel MOS transistor 26 make up the current mirror circuit in which gates of the p-channel MOS transistor 25 and p-channel MOS transistor 26 are connected to each other, when a drain voltage in the p-channel MOS transistor 25 is equal to a drain voltage in the p-channel MOS transistor 26, the drain current $I_{P1}$ flowing through the p-channel MOS transistor 25 becomes equal to a drain current $I_{P2}$ flowing through the p-channel MOS transistor 26. On the other hand, since the n-channel MOS transistor 29 is connected in series to the p-channel MOS transistor 26, depending on a level of a voltage $V_B$ at the node $N_B$ to be applied to the gate of the n-channel MOS transistor 29, a drain current $I_{n2}$ flowing through the n-channel MOS transistor 29 becomes equal to the drain current $I_{P2}$ flowing through the p-channel MOS transistor 26. As a result, when a drain voltage in the p-channel MOS transistor 25 is equal to a drain voltage in the p-channel MOS transistor 26, the drain current $I_{n1}$ flowing through the n-channel MOS transistor 28 becomes equal to the drain current $I_{n2}$ flowing through the n-channel MOS transistor 29.

In this case, since the n-channel MOS transistor 28 is put into an OFF state and, therefore, into a high resistance state, almost no drain current $I_{n1}$ flows and almost no drain current $I_{P1}$ flows through the p-channel MOS transistor 25. Therefore, the p-channel MOS transistor 25 is put into an OFF state and the drain voltage and gate voltage in the p-channel MOS transistor 25 become a voltage being near to the source voltage $V_{CC}$ level out of voltages occurring between the source voltage $V_{CC}$ level and a ground voltage level in response to operations of the n-channel MOS transistor 28 being in a high resistance state. On the other hand, since the n-channel MOS transistor 29 is put into an ON state and into a low resistance state, a drain current $I_{n2}$ flows. Also, since a voltage being close to the source voltage $V_{CC}$ level and occurring between the source voltage $V_{CC}$ level and the ground voltage level is applied to the gate of the p-channel MOS transistor 26 being connected to the gate of the p-channel MOS transistor 25 in common, the p-channel MOS transistor 26 is put into almost an OFF state and into a high resistance state and, therefore, the drain voltage in the p-channel MOS transistor 26 becomes a voltage being close to a ground voltage level and occurring between the source voltage $V_{CC}$ level and the ground voltage level, that is, becomes low, as shown in FIG. 2 (4).

In such the initial state, as shown in FIG. 2 (1), when the one-shot pulse $P_{OS}$ whose voltage changes from a "L" Level to a "H" level is applied to the input terminal of the inverter 21 at time $t_0$, since the inverter 21 inverts the change in the voltage of the one-shot pulse $P_{OS}$ from a "L" Level to a "H" level, an output voltage from the inverter 21 changes from a "H" level to a "L" Level. This causes the inverter 22 to invert the change in the output voltage from the inverter 21 from a "L" Level to a "H" level and, therefore, an output voltage from the inverter 22 changes from a "L" Level to a "H" level. Moreover, since an output voltage from the inverter 21 that changes from a "H" level to a "L" Level is applied to the gate of the p-channel MOS transistor 24, the p-channel MOS transistor 24 changes from an ON state to an OFF state. As a result, the voltage $V_A$ at the node $N_A$, as shown in FIG. 2 (2), changes from a "L" Level to a "H" level. At this point, in the capacitor 32, electric charges corresponding to the capacitance value $C_2$ are accumulated through the p-channel MOS transistor 24 being in an ON state.

On the other hand, as shown in FIG. 2 (1), when the one-shot pulse $P_{OS}$ whose voltage changes from a "L" Level to a "H" level is applied to the input terminal of the inverter 23 at the time $t_0$, since the inverter 23 inverts the change in the voltage of the one-shot pulse $P_{OS}$ from a "L" Level to a "H" level, an output voltage from the inverter 23 changes from a "H" level to a "L" Level. Similarly, as shown in FIG. 2 (1), when the one-shot pulse $P_{OS}$ whose voltage changes from a "L" Level to a "H" level is applied to the gate of the n-channel MOS transistor 27 at the time $t_0$, the n-channel MOS transistor 27 changes from an OFF state to an ON state. As a result, the voltage $V_B$ at the node $N_B$ changes from a "H" level to a "L" Level. At this point, electrical charges accumulated in the capacitor 33 in the initial state are discharged through the n-channel MOS transistor 27. Therefore, to the gate of the n-channel MOS transistor 28 making up the differential circuit 34 is applied a "H" level voltage, while a "L" Level voltage is applied to the gate of the n-channel MOS transistor 29 making up the differential circuit 34. This causes the n-channel MOS transistor 28 in the differential circuit 34 to be put into an ON state and the n-channel MOS transistor 29 to be put into an OFF state and, therefore, as shown in FIG. 2 (4), the differential circuit 34 outputs a "H" level voltage.

That is, in this case, since the n-channel MOS transistor 28 is put into an ON state and into a low resistance state, the drain current $I_{n1}$ flows and, in response to this operation of the n-channel MOS transistor 28, the drain current $I_{P1}$ being equal to the drain current $I_{n1}$ flows through the p-channel MOS transistor 25. Therefore, the p-channel MOS transistor 25 is put into an ON state and a drain voltage and gate voltage in the p-channel MOS transistor 25 becomes a voltage being near to a ground voltage level out of voltages occurring between the source voltage $V_{CC}$ level and the ground voltage level, in response to operations of the n-channel MOS transistor 28 being in a low resistance state. On the other hand, since the n-channel MOS transistor 29 is put into an OFF state, the n-channel MOS transistor 29 is put into a high resistance state and almost no drain current $I_{n2}$ flows. Also, since a voltage being near to a ground voltage level out of voltages occurring between the source voltage $V_{CC}$ level and the ground voltage level is applied to the gate of the p-channel MOS transistor 26 being connected to the gate of the p-channel MOS transistor 25, the p-channel MOS transistor 26 is put into almost an ON state and into a low resistance state and, therefore, the drain voltage in the p-channel MOS transistor 26 becomes a voltage being near to the source voltage $V_{CC}$ level out of voltages occurring between the source voltage $V_{CC}$ level and the ground voltage level, that is, becomes high, as shown in FIG. 2 (4).

Next, as shown in FIG. 2 (1), when a voltage of the one-shot pulse $P_{OS}$ changes from a "H" level to a "L" Level at a time $t_1$, since the inverter 21 inverts the change in the voltage of the one-shot pulse $P_{OS}$ from a "H" level to a "L" Level, an output voltage from the inverter 21 changes from a "L" Level to a "H" level. This causes the inverter 22 to invert the change in the output voltage from the inverter 21 from a "L" Level to a "H" level and, therefore, an output voltage from the inverter 22 changes from a "H" level to a "L" Level. Moreover, since an output voltage from the inverter 21 that changes from a "L" Level to a "H" level is applied to the gate of the p-channel MOS transistor 24, the p-channel MOS transistor 24 changes from an OFF state to an ON state. However, since the first delay circuit made up of the resistor 30 and the capacitor 32 is connected to the node $N_A$, as shown in FIG. 2 (2), discharge of electrical charges accumulated in the capacitor 32 is started from the time $t_1$ and, according to a time constant $C_2R_2$ determined by the capacitance value $C_2$ of the capacitor 32 and the resistance value $R_2$ of the resistor 30, the voltage $V_A$ at the node $N_A$ starts to drop. As a result, the drain current $I_{n1}$ in the n-channel MOS transistor 28 making up the differential circuit 34 starts to decrease.

On the other hand, as shown in FIG. 2 (1), when a voltage of the one-shot pulse $P_{OS}$ changes from a "H" level to a "L" Level at the time $t_1$, since the inverter 23 inverts the change in the voltage of the one-shot pulse $P_{OS}$ from a "H" level to a "L" Level, an output voltage from the inverter 23 changes from a "L" Level to a "H" level. Similarly, as shown in FIG. 2 (1), when a voltage of the one-shot pulse $P_{OS}$ changes from a "H" level to a "L" Level at the time $t_1$, the n-channel MOS transistor 27 changes from an ON state to an OFF state. However, since the second delay circuit made up of the resistor 31 and the capacitor 33 is connected to the node $N_B$, as shown in FIG. 2 (3), accumulation of electrical charges in the capacitor 33 is started from the time $t_1$ and, according to a time constant $C_3R_3$ determined by capacitance value $C_3$ Of the capacitor 33 and the resistance value $R_3$ of the resistor 31, the voltage $V_B$ at the node $N_B$ comes to be boosted. As a result, the drain current $I_{n2}$ in the n-channel MOS transistor 29 making up the differential circuit 34 comes to increase. Then, due to coincidence in voltages between the voltage $V_A$ at the node $N_A$ and the voltage $V_B$ at the node $N_B$ (the coincided voltage is called a "cross-point voltage" and the time when the above two voltages have coincided with each other is called a "time $t_x$"), a current capability of the n-channel MOS transistor 28 making up the differential circuit 34, though it was larger than a current capability of the n-channel MOS transistor 29, becomes smaller than the current capability of the n-channel MOS transistor 29 and, therefore, the differential circuit 34 outputs a "L" Level voltage, as shown in FIG. 2 (4).

Figure 4:
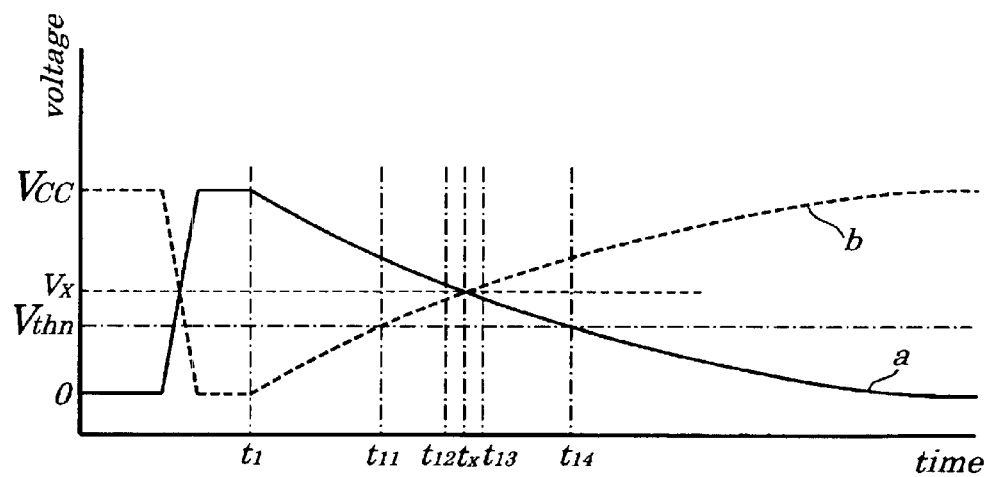
FIG. 4 is a waveform diagram explaining, in detail, operations of the differential circuit making up the pulse generating circuit of the first embodiment of the present invention.
Figure 5:
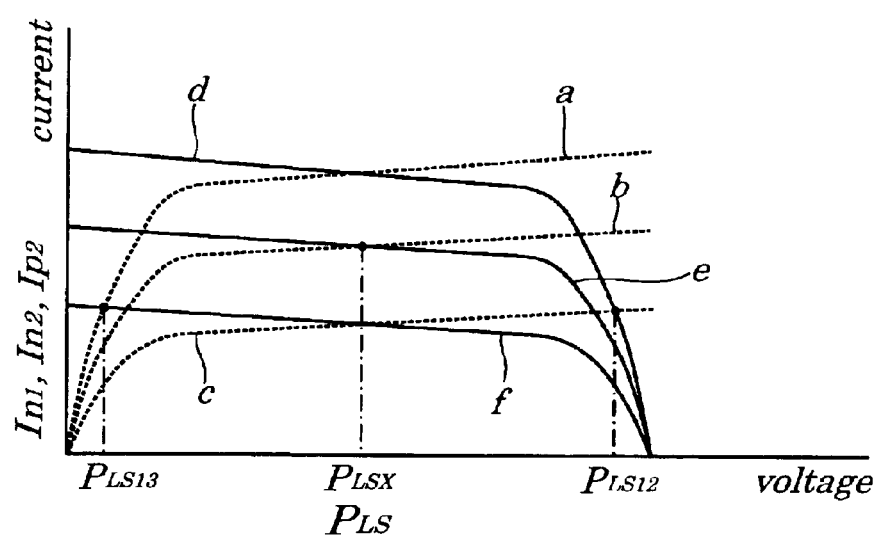
FIG. 5 is a diagram illustrating one example of current characteristics of MOS transistors making up the differential circuit according to the first embodiment of the present invention.

Operations of the differential circuit 34 being performed during a period from the time $t_1$ through the time $t_x$ till a time at which some time elapses thereafter are described below by referring to FIG. 4 and FIG. 5. In FIG. 4, a curve "a" shows a characteristic of the voltage $V_A$ shown in FIG. 2 (2) and a curve "b" shows a characteristic of the voltage $V_B$ shown in FIG. 2 (3), and the threshold voltage $V_{thn}$ shows a threshold voltage of the n-channel MOS transistors 28 and 29. In the differential circuit 34 of the first embodiment, it is necessary that the threshold voltage $V_{thn}$ is 0 V or more and a cross voltage $V_X$ or less. Reasons for that are described later. FIG. 5 shows one example of current characteristics of the p-channel MOS transistor 26 and the n-channel MOS transistors 28 and 29 making up the differential circuit 34. In FIG. 5, a curve "a" shows a characteristic curve for the drain current $I_{n1}$ of the n-channel MOS transistor 28 at a time $t_{12}$ shown in FIG. 4 and for the drain current $I_{n2}$ of the n-channel MOS transistor 29 at a time $t_{13}$ shown in FIG. 4. A curve "b" shows a characteristic curve for the drain current $I_{n1}$ of the MOS n-channel transistor 28 at a time $t_x$ shown in FIG. 4 and for the drain current $I_{n2}$ of the n-channel MOS transistor 29 at the time $t_x$ shown in FIG. 4. A curve "c" shows a characteristic curve for the drain current $I_{n1}$ of the n-channel MOS transistor 28 at the time $t_{13}$ shown in FIG. 4 and for the drain current $I_{n2}$ of the MOS transistor 29 at the time $t_{12}$ shown in FIG. 4. Moreover, a curve "d" shows a characteristic curve for the drain current $I_{P2}$ of the p-channel MOS transistor 26 at the time $t_{12}$ shown in FIG. 4. A curve "e" shows a characteristic curve for the drain current $I_{P2}$ of the p-channel MOS transistor 26 at the time $t_x$ shown in FIG. 4. A curve "f" shows a characteristic curve for the drain current $I_{P2}$ of the p-channel MOS transistor 26 at the time $t_{13}$ shown in FIG. 4.

First, during a period from a time $t_1$ to a time $t_{11}$, since the voltage $V_B$ at the node $N_B$, as shown in FIG. 4, is lower than the threshold voltage $V_{thn}$ of the n-channel MOS transistor 29, the n-channel MOS transistor 29 is in an OFF state, while the voltage $V_A$ at the node $N_A$, as shown in FIG. 4, is higher than a threshold voltage $V_{thn}$ of the n-channel MOS transistor 28 and, therefore, the n-channel MOS transistor 28 is in an ON state. As a result, since the n-channel MOS transistor 28 is put into a low resistance state during the period from the time $t_1$ to the time $t_{11}$, the p-channel MOS transistor 25 is put into an ON state and a drain voltage and gate voltage of the p-channel MOS transistor 25, in response to operations of the n-channel MOS transistor 28 being in a low resistance state, become a voltage being near to a ground voltage level out of voltages between the source voltage $V_{CC}$ level and the ground voltage level, while the n-channel MOS transistor 29 is put into a high resistance state and the p-channel MOS transistor 26, since a voltage being near to the ground voltage level is applied to its gate to which the gate of the p-channel MOS transistor 25 is connected, is put into almost an ON state and into a low resistance state and, therefore, a drain voltage of the p-channel MOS transistor 26, that is, a voltage of an output pulse $P_{LS}$ remains a voltage being near to the source voltage $V_{CC}$, that is, remains high, as shown in FIG. 2 (4).

Next, during the period from the time $t_{11}$ to the time $t_{14}$, since the voltage $V_B$ at the node $N_B$, as shown in FIG. 4, is higher than the threshold voltage $V_{thn}$ of the n-channel MOS transistor 29, the n-channel MOS transistor 29 is in an ON state, and the voltage $V_A$ at the node $N_A$, as shown in FIG. 4, remains higher than the threshold voltage $V_{thn}$ of the n-channel MOS transistor 28 and, therefore, the n-channel MOS transistor 28 is also in an ON state. At the time $t_{12}$, according to the current characteristic of the n-channel MOS transistor 29 (see the curve "c" in FIG. 5) and the current characteristic of the p-channel MOS transistor 26 (see the curve "d" in FIG. 5), a voltage of an output pulse $P_{LS}$ becomes a voltage $P_{LS12}$ at a cross point between the two current characteristic curves "c" and "d" and, therefore, still remains high. Then, at the time $t_x$, according to the current characteristic of the n-channel MOS transistor 29 (see the curve "b" in FIG. 5) and the current characteristic of the p-channel MOS transistor 26 (see the curve "e" in FIG. 5), a voltage of an output pulse $P_{LS}$ becomes a voltage $P_{LSX}$ at a cross point between the two current characteristic curves "b" and "e" and, therefore, becomes approximately $V_{CC}/2$. Moreover, at the time $t_{13}$, according to the current characteristic of the n-channel MOS transistor 29 (see the curve "a" in FIG. 5) and the current characteristic of the p-channel MOS transistor 26 (see the curve "f" in FIG. 5), a voltage of an output pulse $P_{LS}$ becomes a voltage $P_{LS13}$ at a cross point between the two current characteristic curves "a" and "f" and, therefore, becomes an approximate "L" level.

During a period after a time $t_{14}$, since the voltage $V_B$ at the node $N_B$, as shown in FIG. 4, is higher than a threshold voltage $V_{thn}$ of the n-channel MOS transistor 29, the n-channel MOS transistor 29 is in an ON state and the voltage $V_A$ at the node $N_A$, as shown in FIG. 4, is lower than the threshold voltage $V_{thn}$ of the n-channel MOS transistor 28 and, therefore, the n-channel MOS transistor 28 is in an OFF state. As a result, since the n-channel MOS transistor 28 is put into a high resistance state during the period after the time $t_{14}$, the p-channel MOS transistor 25 is put into an OFF state and a drain voltage and gate voltage of the p-channel MOS transistor 25, in response to operations of the n-channel MOS transistor 28 being in a high resistance state, become a voltage being near to the source voltage $V_{CC}$ level out of voltages between the source voltage $V_{CC}$ level and the ground voltage level, while the n-channel MOS transistor 29 is put into a low resistance state and the p-channel MOS transistor 26, since a voltage being near to the source voltage $V_{CC}$ level is applied to its gate to which the gate of the p-channel MOS transistor 25 is connected, is put into almost an OFF state and into a high resistance state and, therefore, a drain voltage of the p-channel MOS transistor 26, that is, a voltage of an output pulse $P_{LS}$ becomes a voltage being near to the ground voltage, that is, remains a "L" level as shown in FIG. 2 (4).

As described above, in the pulse generating circuit of the first embodiment, when both the n-channel MOS transistor 28 and n-channel MOS transistor 29 making up the differential circuit 34 are in an ON state, by using a difference in drain currents between the n-channel MOS transistors 28 and 29 caused by a state in which the voltage $V_A$ to be applied to the gate of the n-channel MOS transistor 28 are made to be different from the voltage $V_B$ to be applied to the gate of the n-channel MOS transistor 29, the output pulse $P_{LS}$ is reversed. As a result, in the pulse generating circuit of the first embodiment, if a threshold voltage $V_{thn}$ of the n-channel MOS transistor 28 is equal to a threshold voltage $V_{thn}$ of the n-channel MOS transistor 29, a pulse width of an output pulse $P_{LS}$ is determined by a cross voltage $V_X$ between the voltages $V_A$ and $V_B$ without being affected by the threshold voltage value $V_{thn}$ itself. Moreover, in the differential circuit 34, when both the n-channel MOS transistors 28 and 29 are put into an OFF state, the p-channel MOS transistors 25 and 26 are also put into an OFF state and, during such the period, an output pulse $P_{LS}$ from the differential circuit 34 is put into an open state, which causes malfunctions of circuits placed at a back stage. Therefore, a threshold voltage $V_{thn}$ of the differential circuit 34 has to be 0 V or more and the cross voltage $V_X$ or less. In other words, during a period from the time $t_1$ to the time $t_{14}$, at least one of the voltage $V_A$ or $V_B$ has to be a threshold voltage $V_{thn}$ or more and a source voltage $V_{CC}$ or less.

Thus, in the pulse generating circuit of the first embodiment of the present invention, the first and second delay circuits are placed and the node $N_A$ being an output terminal of one delay circuit is connected to one of two input terminals of the differential circuit 34 and the node $N_B$ being an output terminal of another delay circuit is connected to another of the two input terminals of the differential circuit 34 so that a pulse width of an output pulse $P_{LS}$ is determined using, as a reference, a cross point value between an output voltage from the first delay circuit that changes from a "H" level to a "L" Level and an output voltage from the second delay circuit that changes from a "L" Level to a "H" level. As a result, no variations in a pulse width of an output pulse $P_{LS}$ occurs even when a process parameter employed at time of manufacturing fluctuates, and especially if a threshold voltage $V_{thn}$ of the n-channel MOS transistors 28 and 29 fluctuates.

Figure 6:
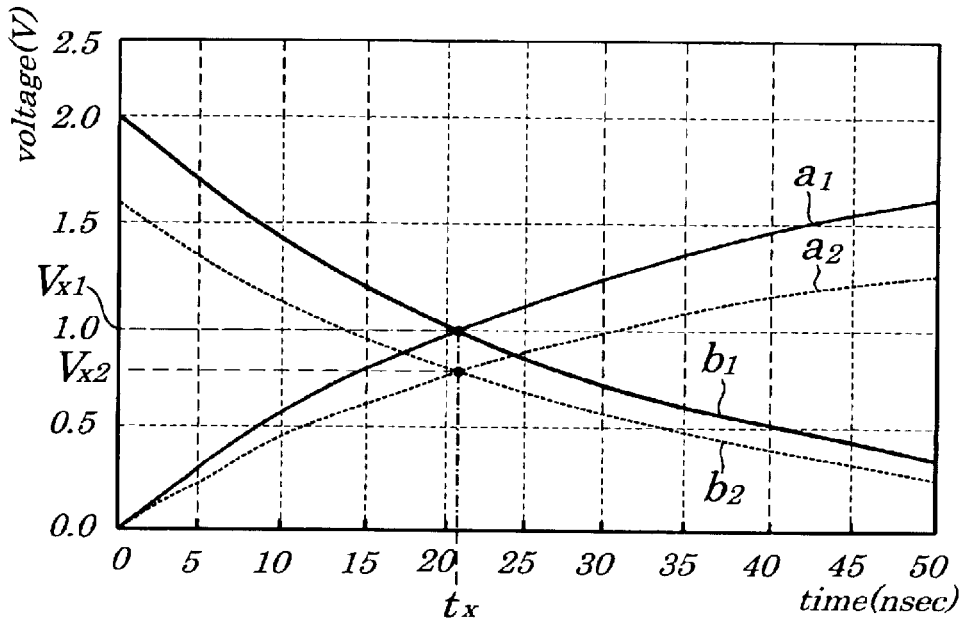
FIG. 6 is a diagram explaining an influence on a pulse width of an output pulse by variations in a source voltage in the pulse generating circuit of the first embodiment of the present invention.
Figure 7:
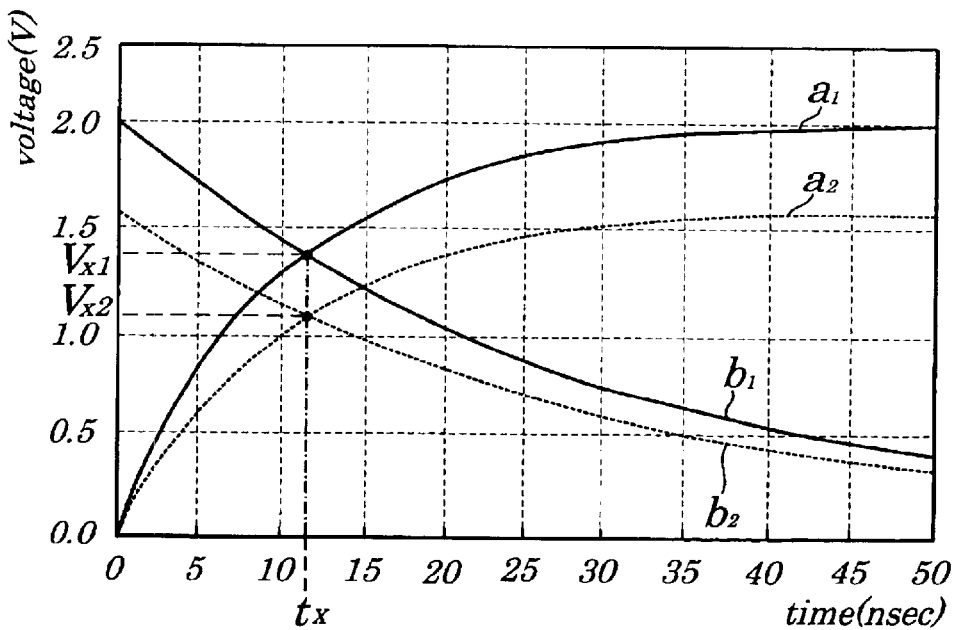
FIG. 7 is also a diagram explaining an influence on a pulse width of an output pulse by variations in a source voltage in the pulse generating circuit of the first embodiment of the present invention.

Moreover, in the pulse generating circuit of the first embodiment, variations in a pulse width of an output pulse $P_{LS}$ are very small even when the source voltage $V_{CC}$ varies at time of operations. Reasons for that are explained by referring to FIG. 6 and FIG. 7. FIG. 6 shows a delay characteristic to be obtained when both time constants $C_1R_1$ and $C_2R_2$ of the first and second delay circuits are 30 nsec ($C_1=C_2=1$ pF, $R_1=R_2=30$ kΩ). In FIG. 6, a curve $a_1$ shows a delay characteristic of the first delay circuit to be obtained when the source voltage $V_{CC}$ is 2.0 V, a curve $a_2$ shows a delay characteristic of the first delay circuit to be obtained when the source voltage $V_{CC}$ is 1.6 V, a curve $b_1$ shows a delay characteristic of the second delay circuit to be obtained when the source voltage $V_{CC}$ is 2.0 V, and a curve $b_2$ shows a delay characteristic of the second delay circuit to be obtained when the source voltage $V_{CC}$ is 1.6 V. As is apparent from FIG. 6, a voltage $V_{X1}$ (about 1.0 V) at the above-mentioned cross point obtained when the source voltage $V_{CC}$ is 2.0 V is different from a voltage $V_{X2}$ (about 0.8 V) at the above-mentioned cross point when the source voltage $V_{CC}$ is 1.6 V, however, the time $t_x$ (about 21 nsec) is not different between the two cases. Also, FIG. 7 shows a delay characteristic occurring when the time constant $C_1R_1$ of the first delay circuit is 30 nsec ($C_1=1$ pF, $R_1=30$ kΩ) and the time constant $C_2R_2$ of the second delay circuit is 10 nsec ($C_2=1$ pF, $R_2=10$ kΩ). In FIG. 7, a curve $a_1$ shows a delay characteristic of the first delay circuit to be obtained when the source voltage $V_{CC}$ is 2.0 V, a curve $a_2$ shows a delay characteristic of the first delay circuit to be obtained when the source voltage $V_{CC}$ is 1.6 V, a curve $b_1$ shows a delay characteristic of the second delay circuit to be obtained when the source voltage $V_{CC}$ is 2.0 V, and a curve $b_2$ shows a delay characteristic of the second delay circuit to be obtained when the source voltage $V_{CC}$ is 1.6 V. As is apparent from FIG. 7, even when the time constant $C_1R_1$ of the first delay circuit is different from the time constant $C_2R_2$ of the second delay circuit, a voltage $V_{X1}$ (about 1.4 V) at the above-mentioned cross point obtained when the source voltage $V_{CC}$ is 2.0 V is different from a voltage $V_{X2}$ (about 1.1 V) at the above-mentioned cross point obtained when the source voltage $V_{CC}$ is 1.6V, however, the time $t_x$ (about 12 nsec) is not different between them.

Figure 22:
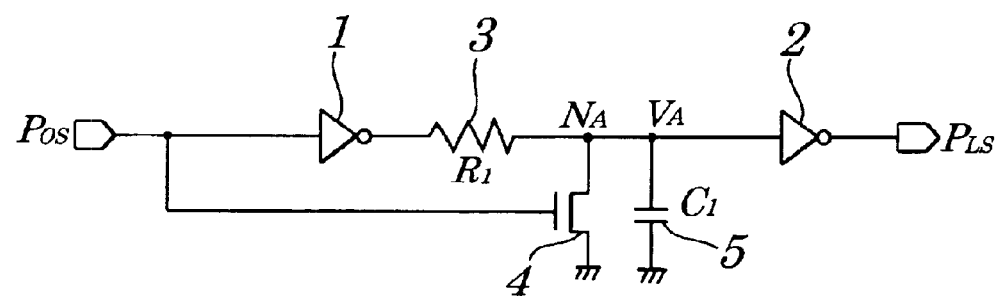
FIG. 22 is a circuit diagram showing configurations of a conventional pulse generating circuit as a first conventional example.

Also, in the pulse generating circuit of the first embodiment of the present invention, as in the case of the first conventional pulse generating circuit (FIG. 22), in some cases, variations occur in the resistance value $R_2$ of the resistor 30 and/or the capacitance value $C_2$ of the capacitor 32 making up the first delay circuit, the resistance value $R_3$ of the resistor 31 and/or the capacitance value $C_3$ of the capacitor 33 making up the second delay circuit. However, as described above, according to the pulse generating circuit of the first embodiment, since there is no influence by variations in the threshold voltage $V_{thn}$ of the n-channel MOS transistors 28 and 29, influence by variations in the resistance value $R_2$ and $R_3$ and/or capacitance values $C_2$ and $C_3$ is small. Since it can be thought the pulse generating circuit of the first embodiment is equivalent to the case where a logical threshold value $V_{INV}$ of the inverter 2 (FIG. 22) is 0.9 V with reference to the first conventional example as shown in FIG. 27, a pulse width of the output pulse $P_{LS}$ varies in a range of 16.64 nsec to 24.95 nsec (range of variations: 8, 31 nsec) and the variation range is about half of that observed in the first conventional pulse generating circuit.

Moreover, though two inverters 21 and 22 are connected in series in a front stage of the resistor 30, since one inverter 23 is connected in a front stage of the resistor 31, signals being transmitted at one end (end portion in the left in FIG. 1) of the resistor 30 are generally delayed by about 0.2 nsec to 0.5 nsec behind signals being transmitted at one end (end portion in the left in FIG. 1) of the resistor 31. However, if a pulse width of an output pulse $P_{LS}$ to be generated is several tens of nanoseconds, the above-mentioned delay is negligible.

Figure 8:
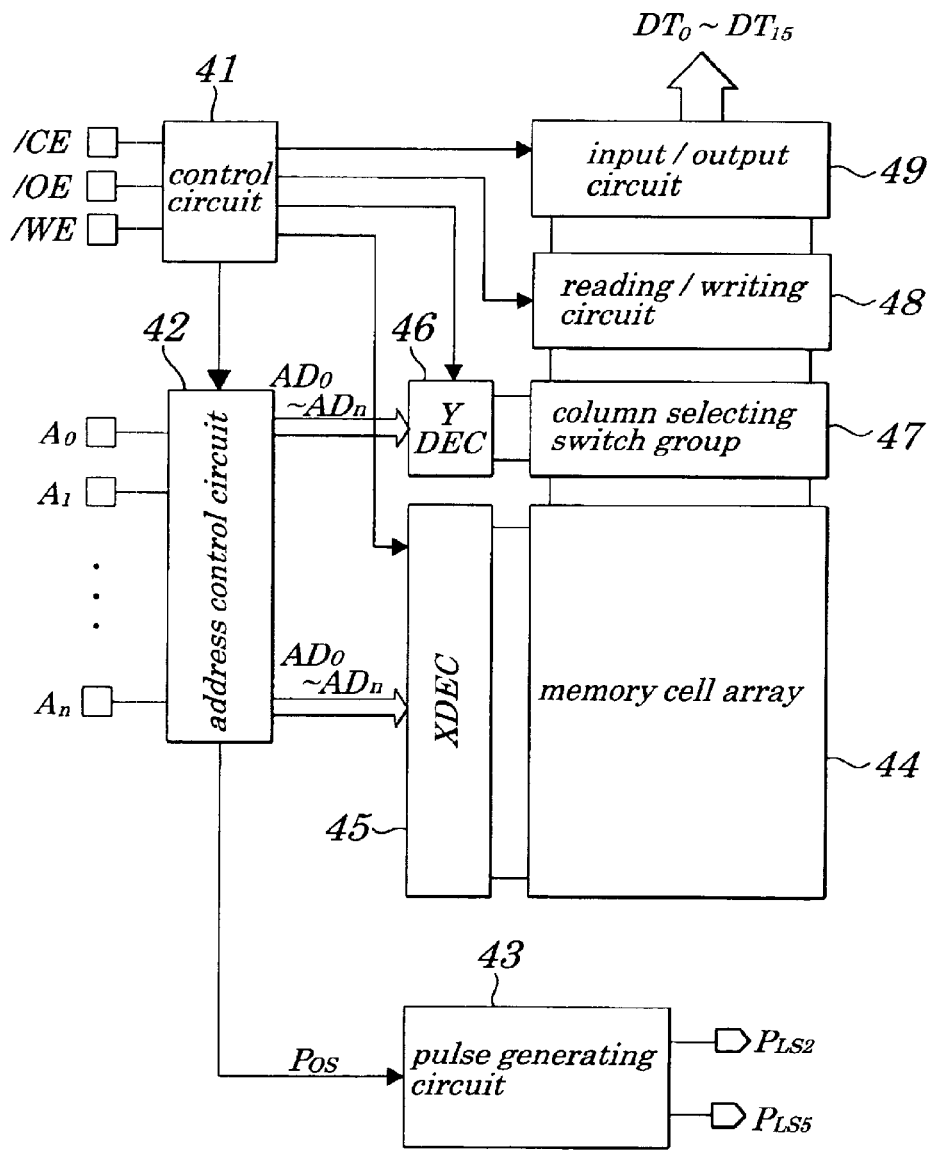
FIG. 8 is a schematic block diagram showing configurations of a flash memory employing the pulse generating circuit of the first embodiment of the present invention.

Next, configurations and operations of a flash memory being applied to the pulse generating circuit of the embodiment are described by referring to FIG. 8 to FIG. 14. FIG. 8 is a schematic block diagram showing configurations of the flash memory. The flash memory employed in the embodiment includes a control circuit 41, an address control circuit 42, a pulse generating circuit 43, a memory cell array 44, a row decoder (XDEC) 45, a column decoder (YDEC) 46, a column selecting switch group 47, a reading/writing circuit 48, and an input/output circuit 49. The control circuit 41, based on a chip enable signal /CE, output enable signal /OE, and write enable signal /WE being fed respectively from an external, outputs various types of control signals to control each component of the flash memory. The chip enable signal /CE, the output enable signal /OE, and the write enable signal /WE are all active low.

The address control circuit 42, based on a control signal fed from the control circuit 41, buffers address bits $A_0$ to $A_n$ (n is a natural number) fed from an outside to output them as address bits $AD_0$ to $AD_n$ and/or generates one-shot unit pulses $P_{OS0}$ to $P_{OSn}$ corresponding to each of address bits $A_0$ to $A_n$ and/or a one-shot pulse $P_{OS}$ obtained by ORing the one-shot unit pulses $P_{OS0}$ to $P_{OSn}$. The pulse generating circuit 43, based on the one-shot pulse $P_{OS}$, generates an output pulse $P_{LS2}$ with a pulse width of 20 nsec and an output pulse $P_{LS5}$ with a pulse width of 50 nsec. As this pulse generating circuit 43, the pulse generating circuit having configurations shown in FIG. 1 is used. The output pulse $P_{LS2}$ is mainly fed to the reading/writing circuit 48 and is used to control timing for pre-charge, for activating a sense amplifier, or a like. Moreover, the output pulse $P_{LS5}$ is mainly fed to the reading/writing circuit 48 and is used to control timing for capturing data or a like.

The memory cell array 44 is made up of a plurality of memory cells being arranged in a matrix form. The row decoder (XDEC) 45 decodes address bits $AD_0$ to $AD_n$ fed from the address control circuit 42 and outputs a row selecting signal to make a word line corresponding to the memory cell array 44 be put into a selected state. The column decoder (YDEC) 46 decodes address bits $AD_0$ to $AD_n$ fed from the address control circuit 42 and outputs a column selecting signal to activate a column selecting switch being placed in such a manner to correspond to a plurality of bit lines in the memory cell array 44.

The column selecting switch group 47 has a plurality of column selecting switches being placed in such a manner to correspond to a plurality of bit lines in the memory cell array 44 in which a column selecting switch activated by a corresponding column selecting signal connects a corresponding bit line in the memory cell array 44 to the reading/writing circuit 48. This causes data to be read from or to be written in a specified memory cell in the memory cell array 44, based on a control signal fed from the control circuit 41. The reading/writing circuit 48, based on a control signal fed from the control circuit 41, reads data from or writes data in a corresponding memory cell in the memory cell array 44. The input/output circuit 49, at time of reading data, based on a control signal fed from the control circuit 41, outputs data read by the reading/writing circuit 48 as 16-bit data $DT_0$ to $DT_{15}$. Also, the input/output circuit 49, at a time of writing data, based on a control signal fed from the control circuit 41, feeds the 16-bit data $DT_0$ to $DT_{15}$ fed from an outside, as writing data, to the reading/writing circuit 48.

Figure 9:
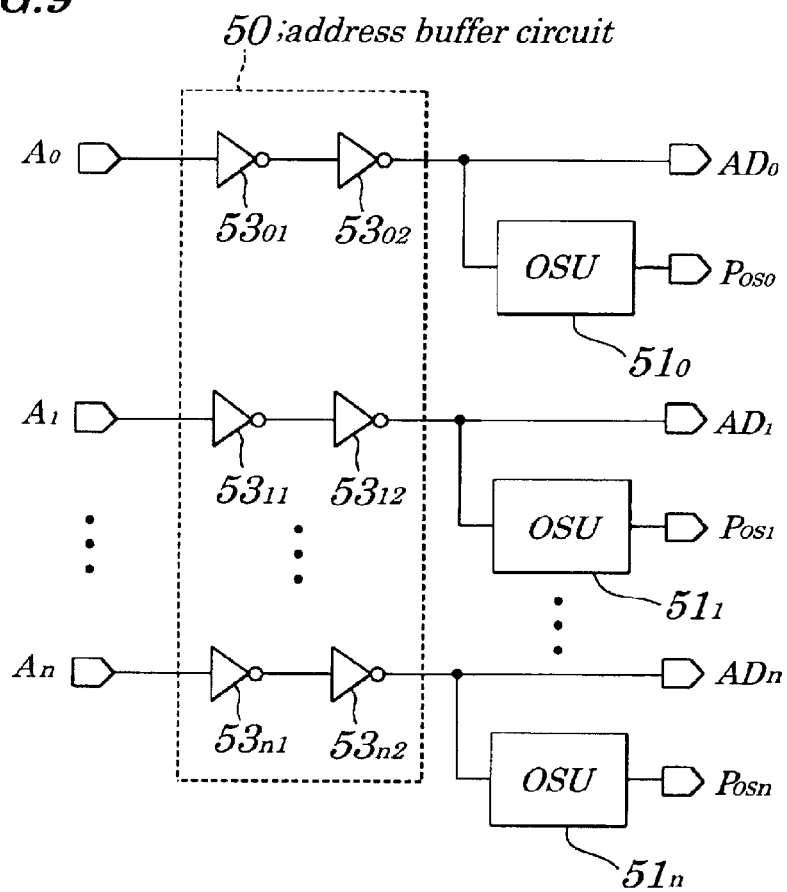
FIG. 9 is a diagram showing an address buffer circuit and an OSU (One-Shot Unit) pulse generating circuit serving as part of an address control circuit making up the flash memory according to the first embodiment of the present invention.
Figure 10:
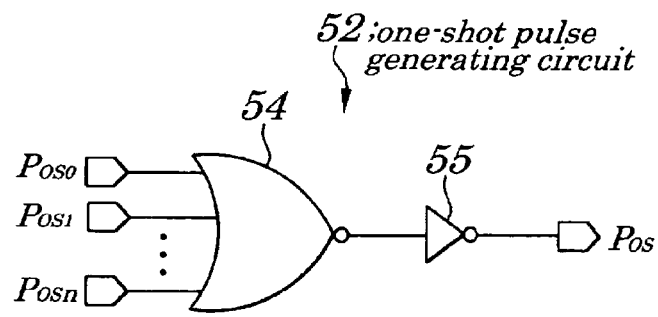
FIG. 10 is a circuit diagram showing configurations of the OSU pulse generating circuit serving as part of the address control circuit according to the first embodiment of the present invention.

The address control circuit 42 is made up of an address buffer circuit 50 shown in FIG. 9, OSU (One-Shot Unit) pulse generating circuits $51_0$ to $51_n$, and a one-shot unit pulse generating circuit 52 shown in FIG. 10. The address buffer circuit 50 includes two serially-connected inverters $53_{01}$ and $53_{02}$, two serially-connected inverters $53_{11}$ and $53_{12}$, . . . , two serially-connected inverters $53_{n1}$ and $53_{n2}$, each of the two inverters being corresponded to each of address bits $A_0$ to $A_n$. Each of the OSU pulse generating circuits $51_0$ to $51_n$, based on address bits $AD_0$ to $AD_n$ fed from corresponding inverters $53_{02}$, $53_{12}$, . . . , $53_{n2}$, generates each of one-shot unit pulses $P_{OS0}$ to $P_{OSn}$. The one-shot pulse generating circuit 52 is made up of a NOR gate 54 with "0" to "n" inputs and inverter 55, and generates a one-shot pulse $P_{OS}$ obtained by ORing one-shot unit pulses $P_{OS0}$ to $P_{OSn}$ fed from each of the OSU pulse generating circuits $51_0$ to $51_n$.

Figure 11:
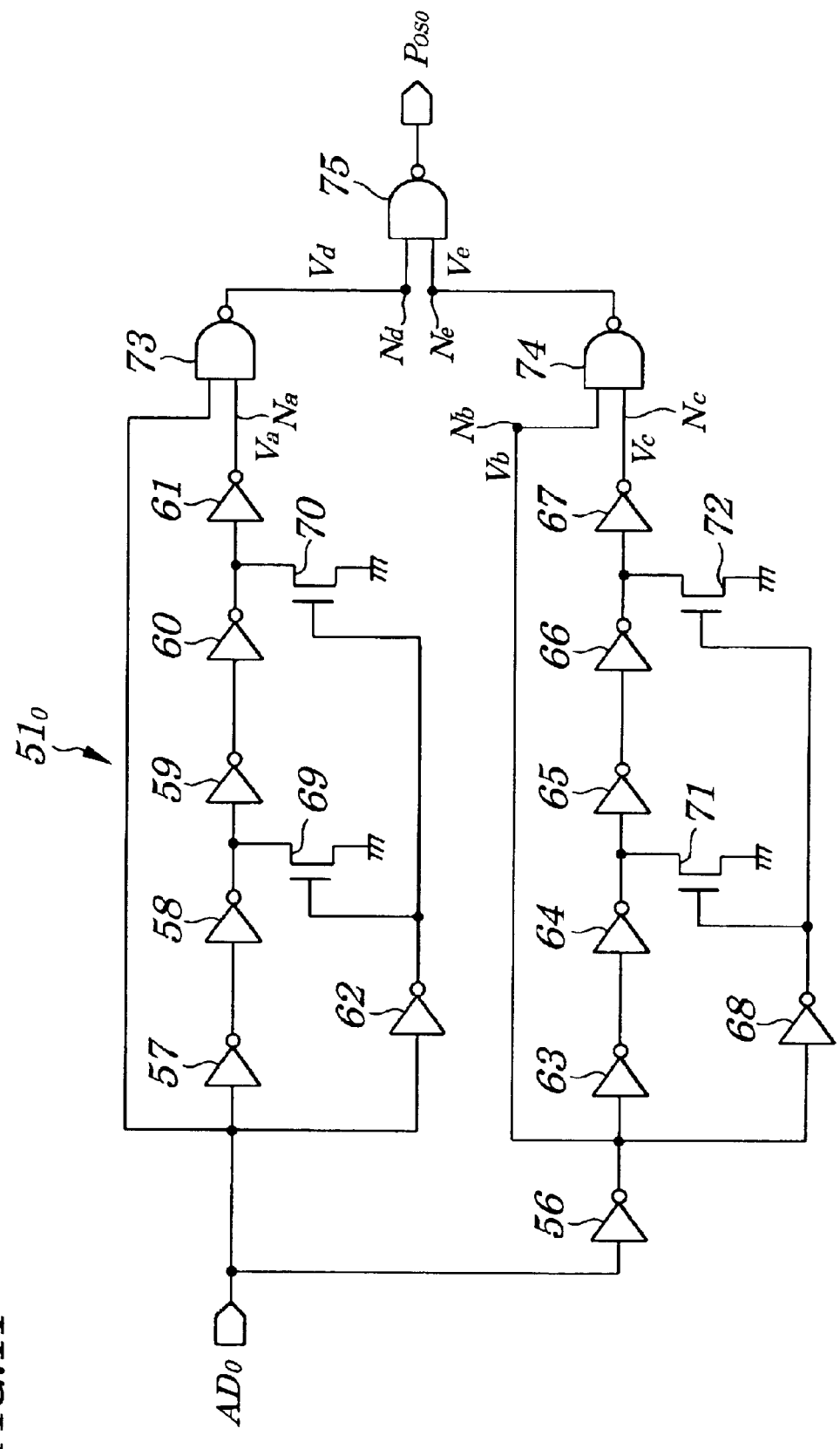
FIG. 11 is a circuit diagram showing configurations of the OSU pulse generating circuit according to the first embodiment of the present invention.

FIG. 11 shows configurations of the OSU pulse generating circuit $51_0$. The OSU pulse generating circuit $51_0$ employed in the embodiment includes inverters 56 to 68, n-channel MOS transistors 69 to 72, and NAND gates 73 to 75. The inverter 56 inverts an address bit $AD_0$ fed from an outside and outputs the inverted address bit. The inverters 57 to 61 are connected to one another in series. The inverter 57 inverts the address bit $AD_0$ fed from the outside and outputs the inverted address bit. Each of the inverters 58 to 61 inverts an output voltage from each of the corresponding inverters placed in its previous stage and outputs the inverted voltage. The inverter 62 inverts the address bit $AD_0$ fed from the outside and outputs the inverted address bit. A gate of the n-channel MOS transistor 69 is connected to an output terminal of the inverter 62, its drain is connected to an output terminal of the inverter 58 and its source is connected to a ground. A gate of the n-channel MOS transistor 70 is connected to an output terminal of the inverter 62, its drain is connected to an output terminal of the inverter 60 and its source is connected to a ground. The NAND gate 73 operates to AND the address bit $AD_0$ fed from its first input terminal and an output voltage from the inverter 61 fed from its second input terminal (hereinafter referred to as "node $N_a$"), inverts the result from the ANDing operation and outputs the inverted voltage.

The inverters 63 to 67 are connected to one another in series. The inverter 63 inverts an output voltage from the inverter 56 and outputs the inverted voltage. Each of the inverters 64 to 67 inverts an output voltage from each of the corresponding inverters placed in its previous stage and outputs the inverted voltage. The inverter 68 inverts an output voltage from the inverter 56 and outputs the inverted voltage. A gate of the n-channel MOS transistor 71 is connected to an output terminal of the inverter 68 and its drain is connected to an output terminal of the inverter 64 and its source is connected to a goround. A gate of the n-channel MOS transistor 72 is connected to an output terminal of the inverter 68 and its drain is connected to an output terminal of the inverter 66 and its source is connected to a ground. The NAND gate 74 operates to AND an output voltage from the inverter 56 fed through its first input terminal (hereinafter referred to as "node $N_b$") and an output voltage from the inverter 67 fed through its second input terminal (hereinafter referred to as "node $N_c$"), inverts the result from the ANDing operation and outputs the inverted voltage. The NAND gate 75 operates to AND an output voltage from the NAND gate 73 fed through its first input terminal (hereinafter referred to as "node $N_d$") and an output voltage from the NAND gate 74 fed through its second input terminal (hereinafter referred to as "node $N_e$"), inverts the result from the ANDing operation and outputs the inverted voltage as a one-shot unit pulse $P_{OS0}$. Moreover, configurations of the OSU pulse generating circuits $51_1$ to $51_n$ are the same as those of the OSU $51_0$ and their descriptions are omitted accordingly.

Figure 12:
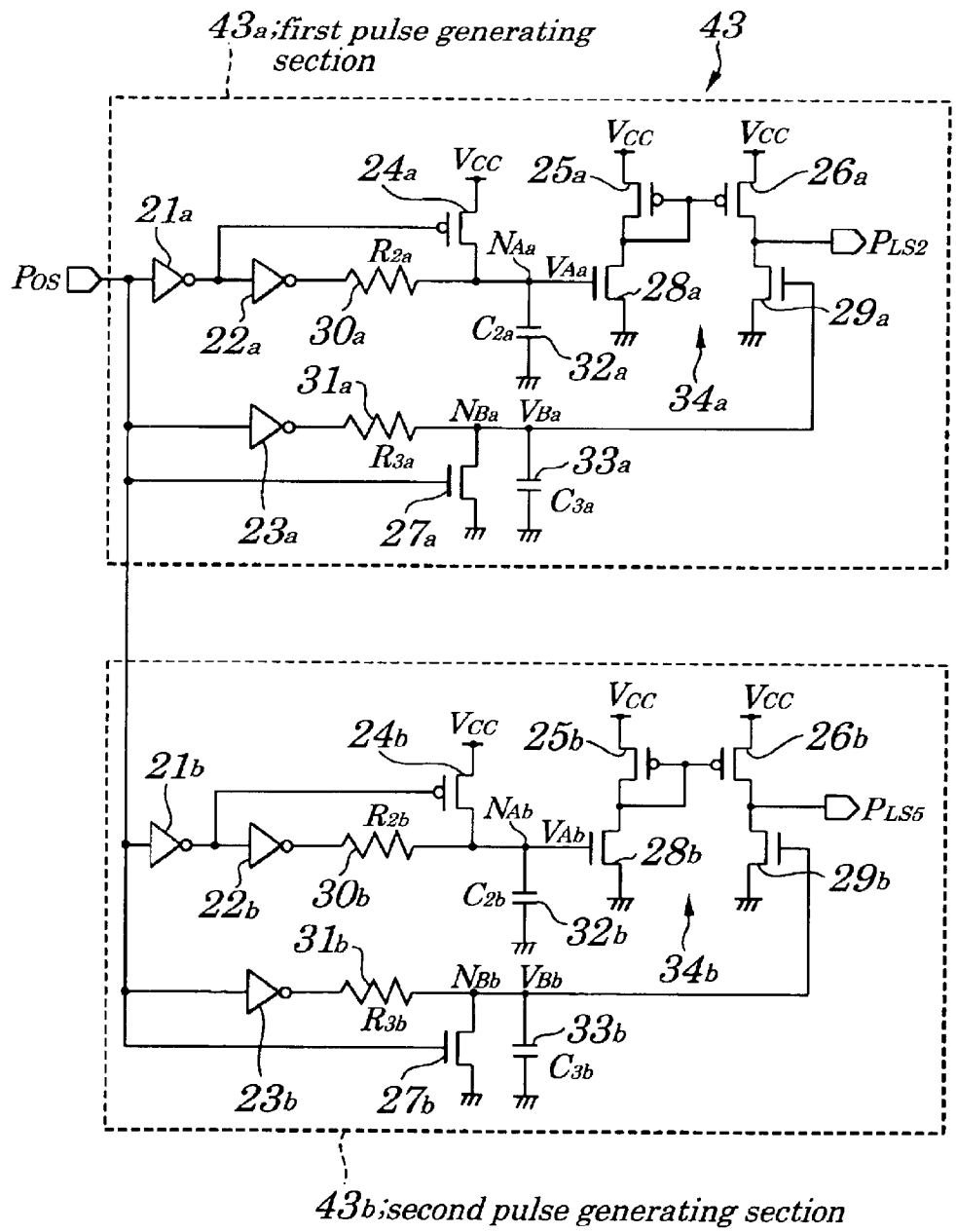
FIG. 12 is a circuit diagram showing configurations of the pulse generating circuit of the first embodiment of the present invention.

FIG. 12 shows configurations of the pulse generating circuit 43. The pulse generating circuit 43 employed in the embodiment is made up of a first pulse generating section $43_a$ and a second pulse generating section $43_b$. Each of the first pulse generating section $43_a$ and the second pulse generating section $43_b$ has the same configurations as the pulse generating circuit shown in FIG. 1 and same reference numbers with different subscripts "a" and "b" are assigned to components having the same functions as those shown in FIG. 1 and their descriptions are omitted accordingly. The first pulse generating circuit $43_a$ outputs an output pulse $P_{LS2}$ having a pulse width of 20 nsec in response to the one-shot pulse $P_{OS}$. The second pulse generating circuit $43_b$ outputs an output pulse $P_{LS5}$ having a pulse width of 50 nsec in response to the one-shot pulse $P_{OS}$.

Figure 13:
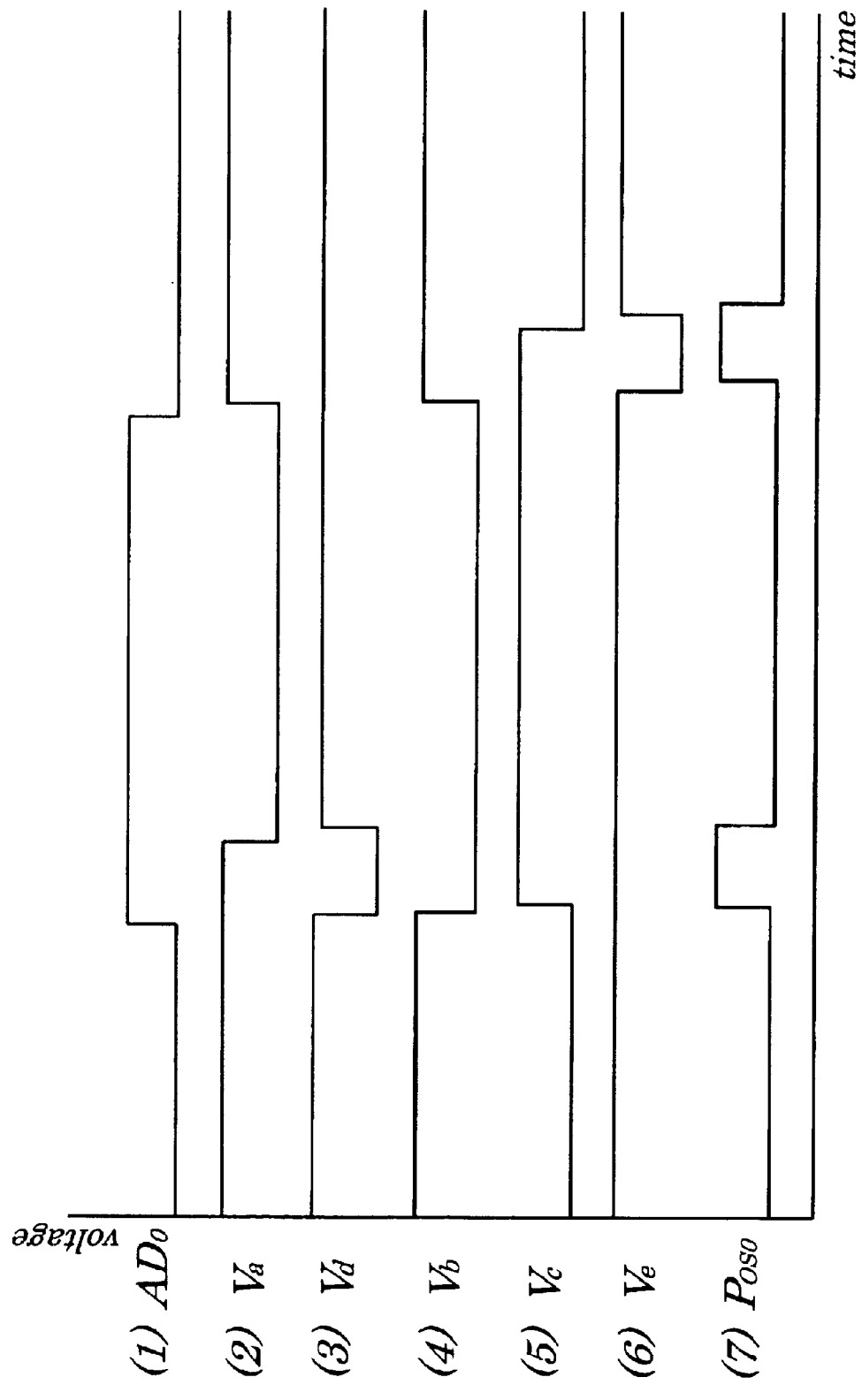
FIG. 13 is a timing chart explaining operations of the OSU (One-Shot Unit) pulse generating circuit according to the first embodiment of the present invention.
Figure 14:
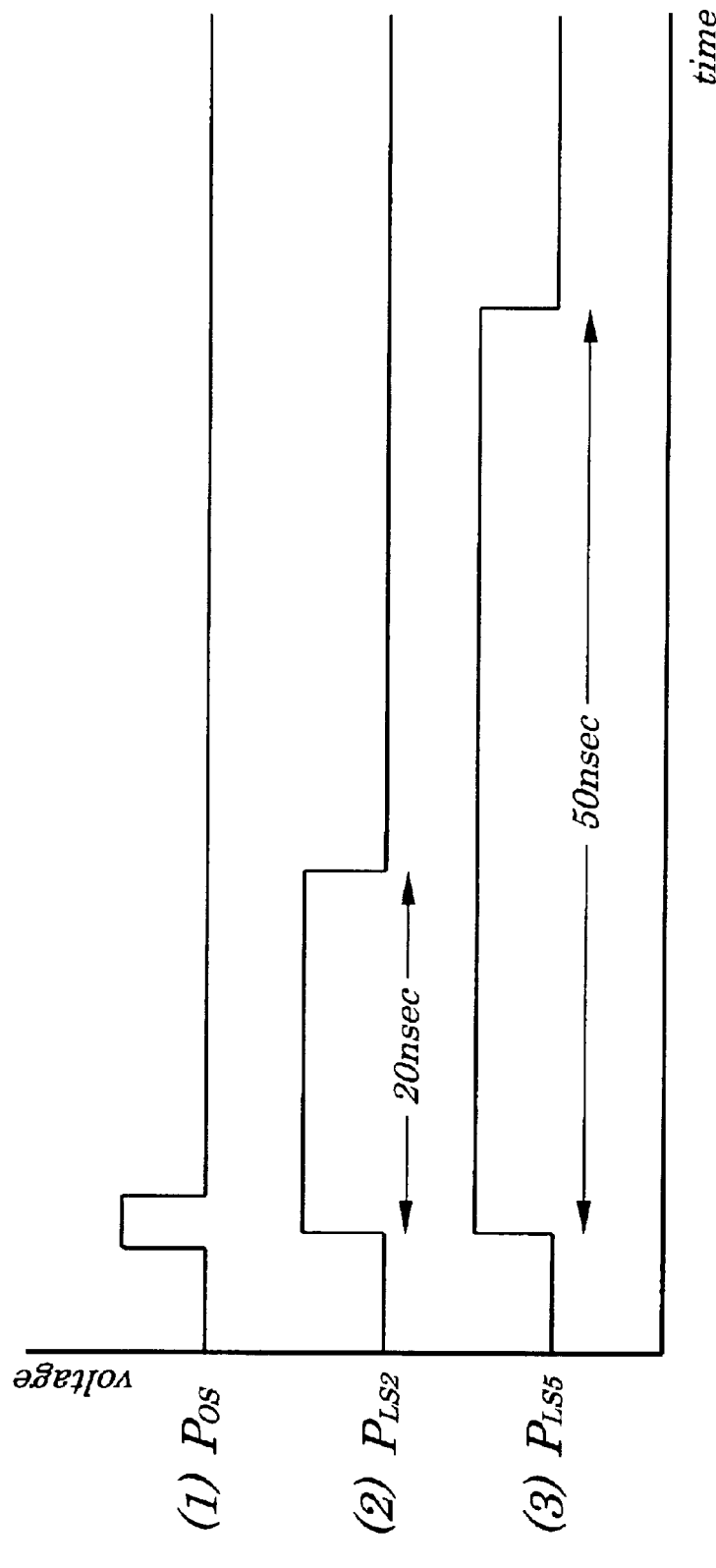
FIG. 14 is a timing chart explaining operations of the pulse generating circuit of FIG. 12.

Next, operations of the OSU pulse generating circuit $51_0$ and the pulse generating circuit 43, out of operations of the flash memory having configurations explained above are described by referring to timing charts shown in FIG. 13 and FIG. 14. First, operations of the OSU pulse generating circuit $51_0$ are described by referring to FIG. 13. In an initial state, an address bit $AD_0$, as shown in FIG. 13 (1), is at a "L" Level. Therefore, a voltage at the first input terminal of the NAND gate 73 is also at a "L" Level. On the other hand, since the inverter 62 inverts a "L" Level address bit $AD_0$ and outputs a "H" level output voltage, both the n-channel MOS transistors 69 and 70 are in an ON state. As a result, a voltage $V_a$ at the second input terminal of the NAND gate 73, that is, a voltage at the node $N_a$, since it is an output voltage from the inverter 61 being placed in a final stages out of the inverters 57 to 61 being connected to one another in series in five stages and receiving a "L" Level address bit $AD_0$, is at a "H" level as shown in FIG. 13 (2). This causes a voltage $V_d$ at an output terminal of the NAND gate 73, that is, a voltage at the node $N_d$ to be at a "H" level, as shown in FIG. 13 (3).

Also, since the inverter 56 inverts a "L" Level address bit $AD_0$ and outputs the inverted address bit, a voltage $V_b$ at the first input terminal of the NAND gate 74, that is, a voltage at the node $N_b$, as shown in FIG. 13 (4), is at a "H" level. The inverter 68 inverts a "H" level output voltage from the inverter 56 and outputs a "L" Level output voltage, the n-channel MOS transistors 71 and 72 are all in an OFF state. As a result, a voltage $V_c$ at the second input terminal of the NAND gate 74, that is, a voltage at the node $N_c$, since it is an output voltage from the inverter 67 being placed in a final stages out of the inverters 63 to 67 being connected to one another in series in five stages and receiving a "H" level address bit $AD_0$, is at a "L" Level as shown in FIG. 13 (5). This causes a voltage $V_e$ at an output terminal of the NAND gate 74, that is, a voltage at the node $N_e$ to be at a "H" level, as shown in FIG. 13 (6). Therefore, an output voltage from the NAND gate 75, that is, a voltage of a one-shot unit pulse $P_{OS0}$ is at a "L" Level as shown in FIG. 13 (7).

In such the initial state, as shown in FIG. 13 (1), when an address bit $AD_0$ changes from a "L" Level to a "H" level, a voltage at the first input terminal of the NAND gate 73 changes from a "L" Level to a "H" level. On the other hand, since the inverter 62 inverts an address bit $AD_0$ that changes from a "L" Level to a "H" level and outputs an output voltage that changes from a "H" level to a "L" Level, both the n-channel MOS transistors 69 and 70 change from an ON state to an OFF state. As a result, a voltage at the node $N_a$, since it is an output voltage from the inverter 61 being placed in a final stage out of the inverters 57 to 61 being connected to one another in series in five stages, changes from a "H" level to a "L" Level after time corresponding to a sum total of transmission delay time of each of the inverters 57 to 61 has elapsed since the address bit $AD_0$ changed from a "L" Level to a "H" level as shown in FIG. 13 (2). Therefore, the voltage at the node $N_d$, as shown in FIG. 13 (3), changes from a "H" level to a "L" Level after the address bit $AD_0$ has changed from a "L" Level to a "H" level and, then, changes from a "L" Level to a "H" level after a voltage at the node $N_a$ has changed from a "H" level to a "L" Level.

Moreover, since the inverter 56 inverts an address bit $AD_0$ that changes from a "L" Level to a "H" level and outputs the inverted voltage, a voltage $V_b$ at the first input terminal of the NAND gate 74, that is, a voltage at the node $N_b$, as shown in FIG. 13 (4), changes from a "H" level to a "L" Level. On the other hand, the inverter 68 inverts an output voltage from the inverter 56 that changes from a "H" level to a "L" Level and outputs an output voltage that changes from a "L" Level to a "H" level, both the n-channel MOS transistors 71 and 72 change from an OFF state to an ON state. As a result, a voltage at the node $N_c$, as shown in FIG. 13 (5), changes from a "L" Level to a "H" level after the address bit $AD_0$ has changed from a "L" Level to a "H" level. This causes a voltage at the node $N_e$ to remain at a "H" level, as shown in FIG. 13 (6). Therefore, the one-shot unit pulse $P_{OS0}$, as shown in FIG. 13 (7), changes from a "L" Level to a "H" level after the address bit $AD_0$ has changed from a "L" Level to a "H" level and then changes from a "H" level to a "L" level after time corresponding to a sum total of transmission delay time of each of the inverters 57 to 61 has elapsed since the address bit $AD_0$ changed from a "L" Level to a "H" level.

Next, as shown in FIG. 13 (1), when the address bit $AD_0$ changes from a "H" level to a "L" Level, a voltage at the first input terminal of the NAND gate 73 changes from a "H" level to a "L" Level. Since the inverter 62 inverts an address bit $AD_0$ that changes from a "H" level to a "L" Level and outputs an output voltage that changes from a "L" Level to a "H" level, both the n-channel MOS transistors 69 and 70 change from an OFF state to an ON state. Then, a voltage at the node $N_a$, as shown in FIG. 13 (2), changes from a "L" Level to a "H" level after the address bit $AD_0$ has changed from a "H" level to a "L" Level. This causes a voltage at the node $N_d$ to remain at a "H" level as shown in FIG. 13 (3).

Also, since the inverter 56 inverts an address bit $AD_0$ that changes from a "H" level to a "L" Level and outputs the inverted voltage, a voltage at the node $N_b$, as shown in FIG. 13 (4), changes from a "L" Level to a "H" level. Since the inverter 68 inverts an address bit $AD_0$ that changes from a "L" Level to a "H" level and outputs an output voltage that changes from a "H" level to a "L" Level, both the n-channel MOS transistors 71 and 72 change from an ON state to an OFF state. As a result, a voltage at the node $N_c$, since it is an output voltage from the inverter 67 being placed in a final stage out of the inverters 63 to 67 being connected to one another in series in five stages, as shown in FIG. 13 (5), changes from a "H" level to a "L" Level after time corresponding to a sum total of transmission delay time of each of the inverters 63 to 67 has elapsed since the output voltage from the inverter 56 changed from a "L" Level to a "H" level. Therefore, the voltage at the node $N_e$, as shown in FIG. 13 (6), changes from a "H" level to a "L" Level after the output voltage from the inverter 56 has changed from a "L" Level to a "H" level and, then, changes from a "L" Level to a "H" level after a voltage at the node $N_c$ has changed from a "H" level to a "L" Level. As a result, the one-shot unit pulse $P_{OS0}$, as shown in FIG. 13 (7), changes from a "L" Level to a "H" level after the address bit $AD_0$ has changed from a "H" level to a "L" Level and, then, changes from a "H" level to a "L" Level after time corresponding to a sum total of transmission delay time of each of the inverters 63 to 67 has elapsed since the an output from the inverter 56 changed from a "L" Level to a "H" level.

Next, operations of the pulse generating circuit 43 are described by referring to FIG. 14. However, operations of each of configurations making up the first and second pulse generating sections $43_a$ and $43_b$ shown in FIG. 12 are the same as those of the pulse generating circuit shown in FIG. 1 described by referring to FIG. 2, FIG. 4 and FIG. 5 and their descriptions are omitted accordingly. First, in an initial state, as shown in FIG. 14 (1), since a one-shot pulse $P_{OS}$ is at a "L" Level, both the output pulses $P_{LS2}$ and $P_{LS5}$, as shown in FIG. 14 (2) and (3), are at a "L" Level. Next, when a one-shot pulse $P_{OS}$ with a specified pulse width is fed, both the output pulses $P_{LS2}$ and $P_{LS5}$, as shown in FIG. 14 (2) and (3), change from a "L" Level to a "H" level. Then, the output pulse $P_{LS2}$, after having remained at a "H" level during a pulse width (in the example, 20 nsec) which is determined using, as a reference, a cross point between an output voltage $V_{Aa}$ (FIG. 12), that changes from a "H" level to a "L" Level, from the first delay circuit made up of a resistor $30_a$ (FIG. 12) and a capacitor $32_a$ (FIG. 12) and an output voltage $V_{Ba}$ (FIG. 12), that changes from a "L" Level to a "H" level, from the second delay circuit made up of a resistor $31_a$ (FIG. 12) and a capacitor $33_a$ (FIG. 12), changes from the "H" level to a "L" Level. The output pulse $P_{LS5}$, after having remained at a "H" level during a pulse width (in the example, 50 nsec) which is determined using, as a reference, a cross point between an output voltage $V_{Ab}$ (FIG. 12), that changes from a "H" level to a "L" Level, from the first delay circuit made up of a resistor $30_b$ (FIG. 12) and a capacitor $32_b$ (FIG. 12) and an output voltage $V_{Bb}$ (FIG. 12), that changes from a "L" Level to a "H" level, from the second delay circuit made up of a resistor $31_b$ (FIG. 12) and a capacitor $33_b$ (FIG. 12), changes from the "H" level to a "L" Level. Thus, the pulse generating circuit shown in FIG. 1, in the flash memory, can be applied when output pulses $P_{LS2}$ and $P_{LS5}$ each having a specified pulse width are generated in response to an one-shot pulse $P_{OS}$.

Second Embodiment

Figure 15:
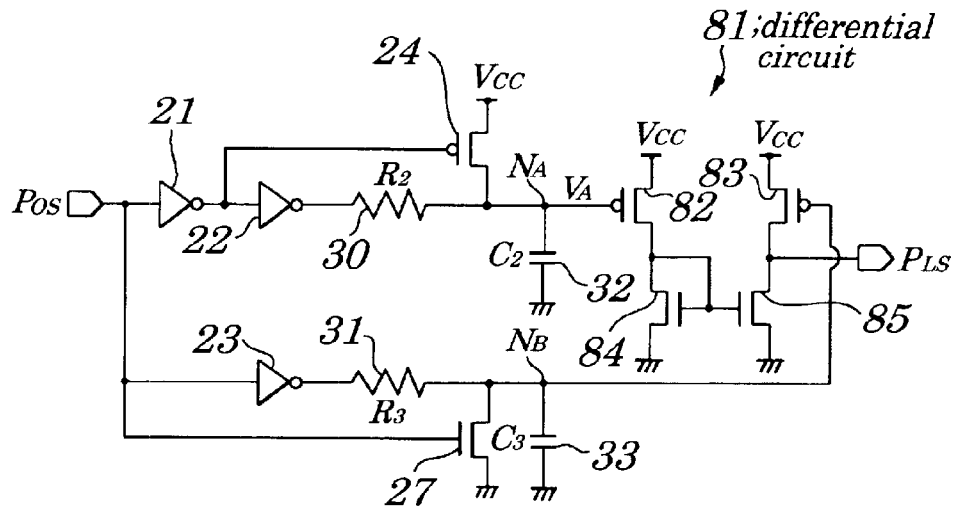
FIG. 15 is a circuit diagram showing configurations of a pulse generating circuit according to a second embodiment of the present invention.

FIG. 15 is a circuit diagram showing configurations of a pulse generating circuit according to a second embodiment of the present invention. In FIG. 15, same reference numbers are assigned to components having the same functions as those of components shown in FIG. 1 and their descriptions are omitted accordingly. In the pulse generating circuit shown in FIG. 15, instead of a differential circuit 34 shown in FIG. 1, a differential circuit 81 is newly provided. The differential circuit 81 of the second embodiment includes p-channel MOS transistors 82 and 83 and n-channel MOS transistors 84 and 85. A gate of the p-channel MOS transistor 82 is connected to a node $N_A$ and its source is connected to a source voltage $V_{CC}$ terminal and its drain is connected to a drain of the n-channel MOS transistor 84. A gate of the p-channel MOS transistor 83 is connected to a node $N_B$ and its source is connected to a source voltage $V_{CC}$ terminal and its drain is connected to a drain of the n-channel MOS transistor 85 and an output pulse $P_{LS}$ is output from the p-channel MOS transistor 83. A gate of the n-channel MOS transistor 84 is connected to its drain and to a gate of the n-channel MOS transistor 85. A source of the n-channel MOS transistor 85 is connected to a ground. The n-channel MOS transistors 84 and 85 make up a current mirror circuit. A threshold voltage $V_{thp}$ of the p-channel MOS transistor 82 is set to be equal to that of the p-channel MOS transistor 83.

Figure 16:
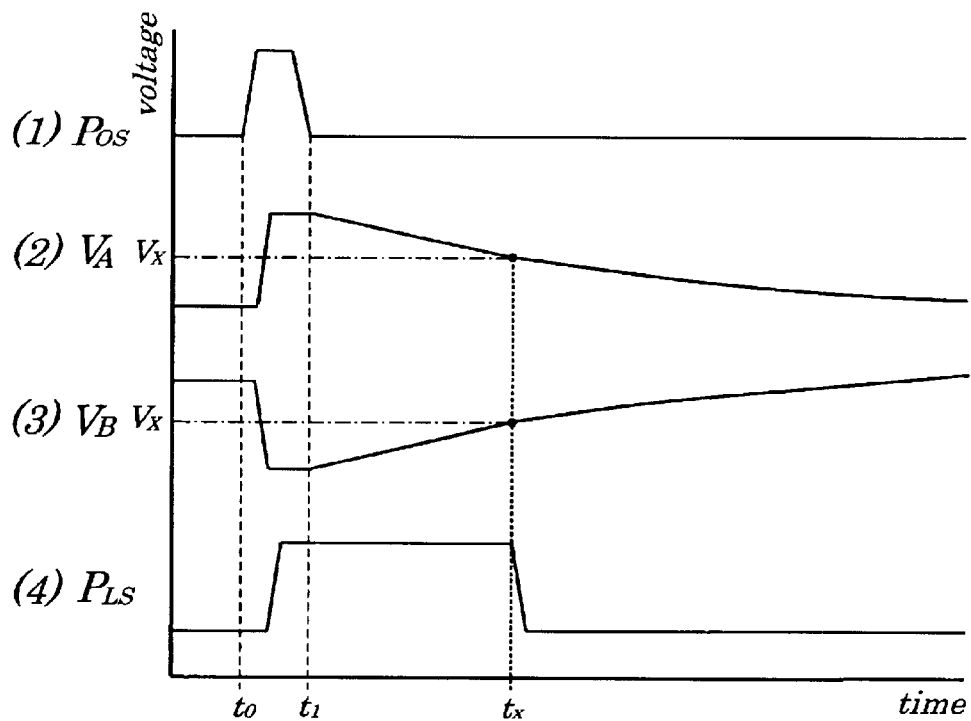
FIG. 16 is a waveform diagram explaining operations of the pulse generating circuit of the second embodiment of the present invention.
Figure 17:
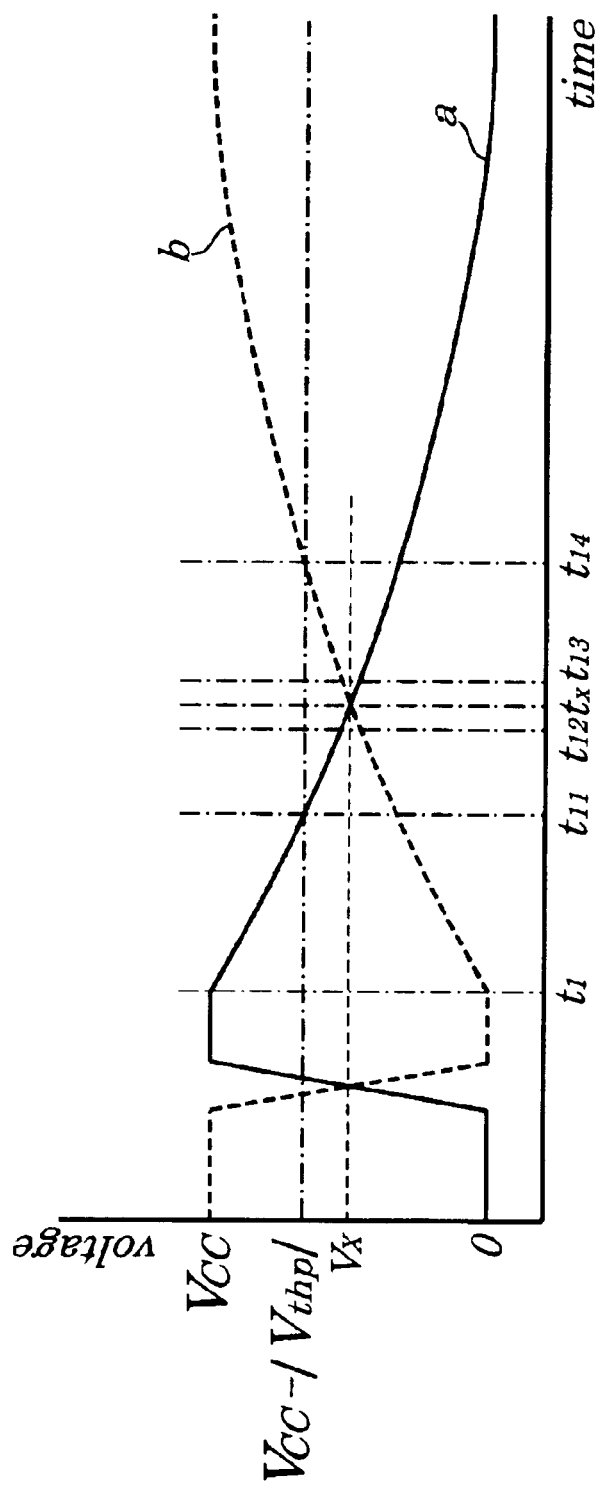
FIG. 17 is a waveform diagram explaining, in detail, operations of the pulse generating circuit of the second embodiment of the present invention.

Moreover, operations of the pulse generating circuit having configurations described above are the same as those of the pulse generating circuit shown in FIG. 1 except that the p-channel MOS transistors 82 and 83 are placed in an input stage and its waveform diagram shown in FIG. 16 is the same as that shown in FIG. 2 and their descriptions are omitted accordingly. Thus, in the pulse generating circuit of the second embodiment, though, instead of the differential circuit 34 in which n-channel MOS transistors 28 and 29 shown in FIG. 1 are placed in its input stages, the differential circuit 81 in which the p-channel MOS transistors 82 and 83 are placed in its input stage, same effects obtained in the first embodiment can be achieved. However, in the differential circuit shown in FIG. 15, if both the p-channel MOS transistors 82 and 83 are put in an OFF state, both the n-channel MOS transistors 84 and 85 are also put in an OFF state and, during such the period, the output pulse $P_{LS}$ is put into an open state, which causes circuits mounted in a back stage to fail to function normally. Therefore, in the differential circuit 81, it is necessary that a source voltage $V_{CC}$ and an absolute value $|V_{thp}|$ of a threshold voltage $V_{thp}$ are the cross voltage $V_X$ or more and a source voltage $V_{CC}$ or less. In other words, during a period from time $t_1$ to time $t_{14}$, at least one of the voltage $V_A$ or voltage $V_B$ is 0 or more and the source voltage $V_{CC}$ and an absolute value $|V_{thp}|$ of the threshold voltage $V_{thp}$ are a threshold voltage $V_{thn}$ or less (see FIG. 17).

Third Embodiment

Figure 18:
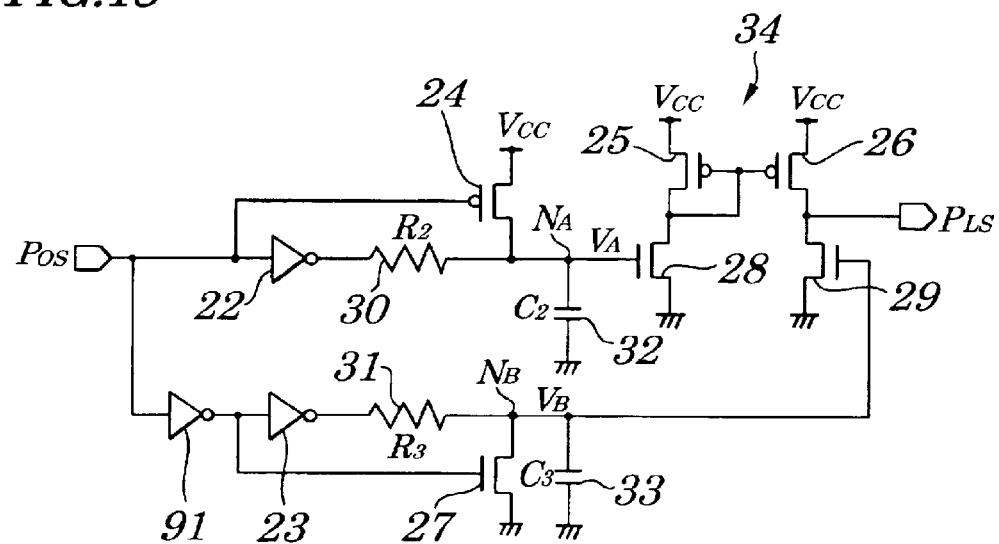
FIG. 18 is a circuit diagram showing configurations of a pulse generating circuit according to a third embodiment of the present invention.
Figure 19:
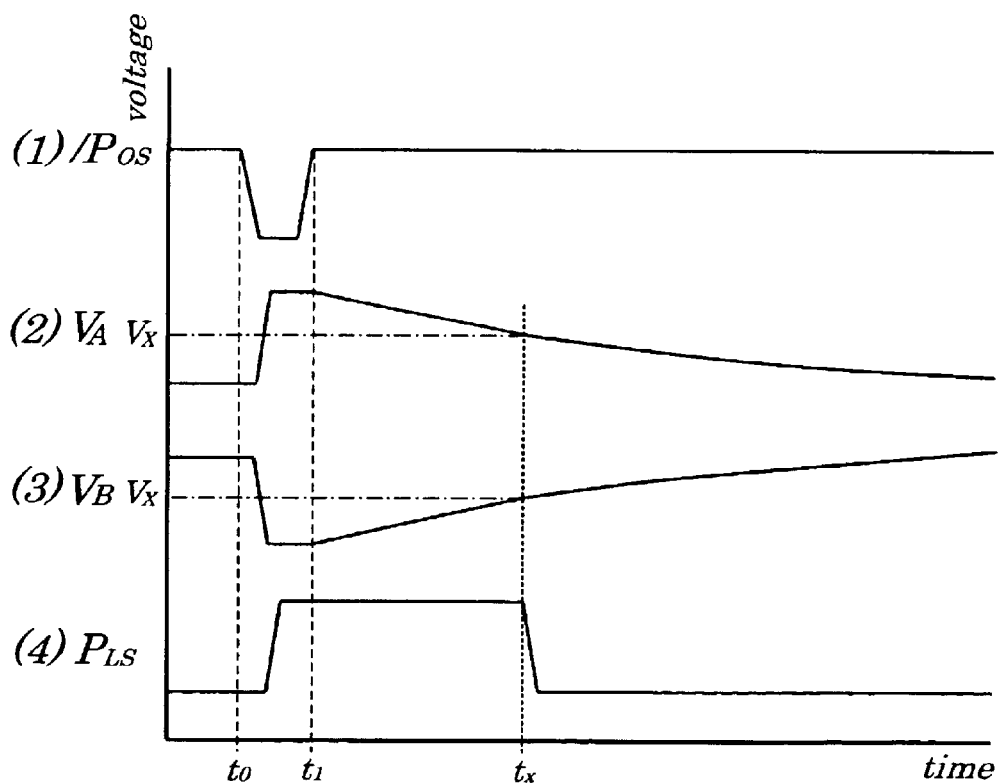
FIG. 19 is a waveform diagram explaining operations of the pulse generating circuit of the third embodiment of the present invention.

FIG. 18 is a circuit diagram showing configurations of a pulse generating circuit according to a third embodiment of the present invention. In FIG. 18, same reference numbers are assigned to components having the same functions as those of components shown in FIG. 1 and their descriptions are omitted accordingly. In the pulse generating circuit shown in FIG. 18, instead of an inverter 21 shown in FIG. 1, an inverter 91 is connected between an input terminal of the pulse generating circuit and an input terminal of an inverter 23 and between the input terminal of the pulse generating circuit and a gate of an n-channel MOS transistor 27. An inverter 22, a p-channel MOS transistor 24, a resistor 30, and a capacitor 32 make up a first voltage outputting section. The inverters 23 and 91, the n-channel MOS transistor 27, a resistor 31, and a capacitor 33 make up a second voltage outputting section. In the pulse generating circuit of the third embodiment, as shown in FIG. 19 (1), a one-shot pulse/$P_{OS}$ being active low is fed. Moreover, operations of the pulse generating circuit having configurations described above are the same as those of the pulse generating circuit shown in FIG. 1 except that a one-shot pulse/$P_{OS}$ being active low is fed and its waveform diagram shown in FIG. 19 is the same as that shown in FIG. 2 and their descriptions are omitted accordingly. Thus, in the pulse generating circuit of the third embodiment, when a one-shot pulse/$P_{OS}$ being active low is fed, an output pulse $P_{LS}$ with a specified pulse width can be generated and therefore same effects obtained in the first embodiment can be achieved.

Fourth Embodiment

Figure 20:
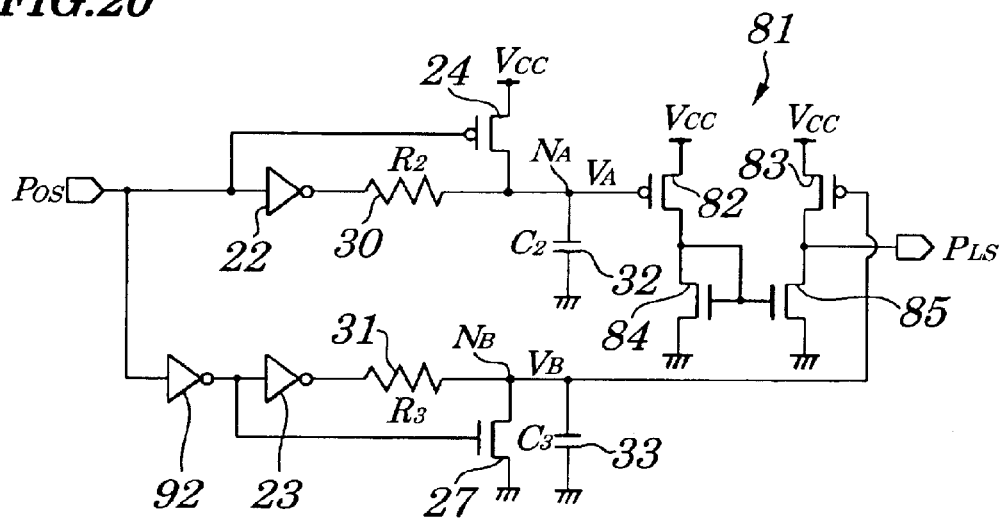
FIG. 20 is a circuit diagram showing configurations of a pulse generating circuit according to a fourth embodiment of the present invention.
Figure 21:
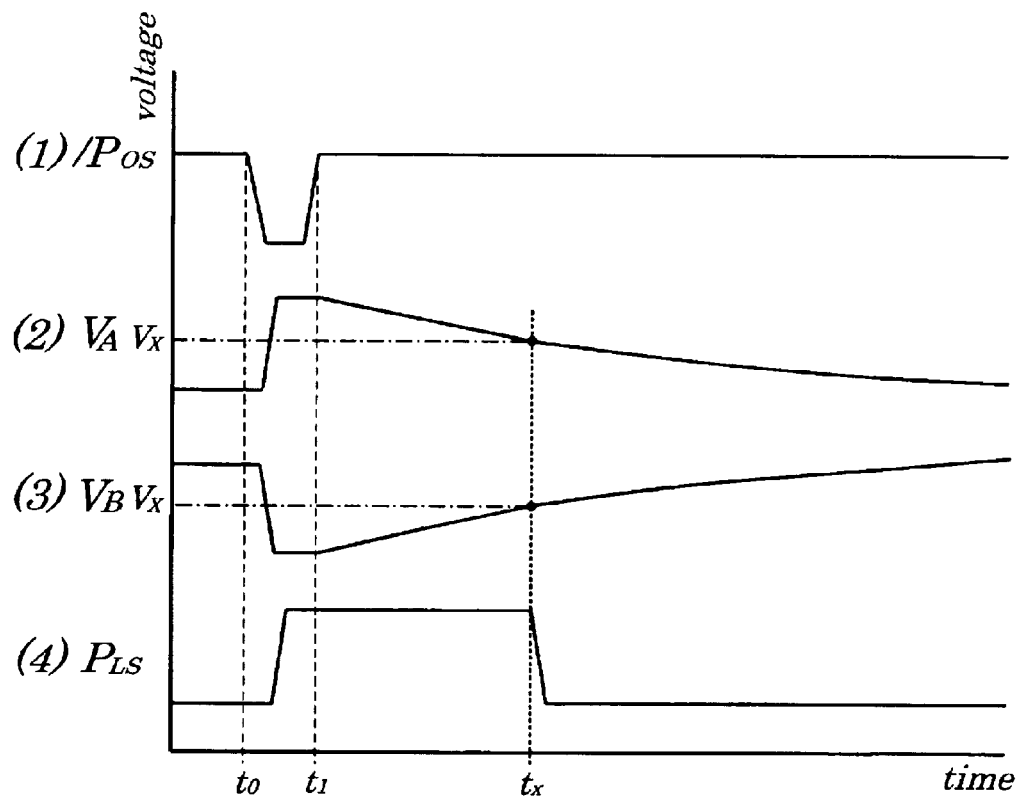
FIG. 21 is a waveform diagram explaining operations of the pulse generating circuit of the fourth embodiment of the present invention.

FIG. 20 is a circuit diagram showing configurations of a pulse generating circuit according to a fourth embodiment of the present invention. In FIG. 20, same reference numbers are assigned to components having the same functions as those of components shown in FIG. 15 and their descriptions are omitted accordingly. In the pulse generating circuit shown in FIG. 20, instead of an inverter 21 shown in FIG. 15, an inverter 92 is connected between an input terminal of the pulse generating circuit and an input terminal of an inverter 23 and between the input terminal of the pulse generating circuit and a gate of an n-channel MOS transistor 27. An inverter 22, a p-channel MOS transistor 24, a resistor 30, and a capacitor 32 make up a first voltage outputting section. The inverters 23 and 92, the n-channel MOS transistor 27, a resistor 31, and a capacitor 33 make up,a second voltage outputting section. As shown in FIG. 21 (1), to the pulse generating circuit of the fourth embodiment is applied a one-shot pulse/$P_{OS}$ being active low. Moreover, operations of the pulse generating circuit having configurations described above are the same as those of the pulse generating circuit shown in FIG. 15 except that a one-shot pulse/$P_{OS}$ being active low is fed and its waveform diagram shown in FIG. 21 is the same as that shown in FIG. 16 except FIG. 21 (1) and their descriptions are omitted accordingly. Thus, in the pulse generating circuit of the fourth embodiment, when a one-shot pulse/$P_{OS}$ being active low is fed, an output pulse $P_{LS}$ with a specified pulse width can be generated and therefore same effects obtained in the second embodiment can be achieved.

It is apparent that the present invention is not limited to the above embodiments but may be changed and modified without departing from the scope and spirit of the invention. For example, relations between the time constant $C_2R_2$ and the time constant $C_3R_3$ making up each of the pulse generating circuits in each of the embodiments are not mentioned, however, as is apparent from FIG. 6 and FIG. 7, no influence occurs by variations in the source voltage $V_{CC}$ even if the time constant $C_2R_2$ is equal to or different from the time constant $C_3R_3$. Therefore, in processes employed in manufacturing semiconductor devices, if it is possible to perform manufacturing in a manner that the time constant $C_2R_2$ is equal to the time constant $C_3R_3$, such the manufacture may be acceptable and, if it is difficult to perform manufacturing in a manner that the time constant $C_2R_2$ is equal to the time constant $C_3R_3$, the manufacturing may be performed in a manner that the time constant $C_2R_2$ is different from the time constant $C_3R_3$. Moreover, in each of the embodiments, the pulse generating circuit of the present invention is used as a single unit or in a flash memory, however, the present invention is not limited to this, that is, the pulse generating circuit of the present invention may be applied to semiconductor devices such as an SRAM, DRAM, PROM, EPROM, EEPROM, or a like, to a SOC (System On a Chip) device obtained by incorporating these semiconductors, CPU (Central Processing Unit), system constructed by connecting a plurality of input and output devices or a like via buses into one semiconductor chip and/or to semiconductor devices such as an ASIC (Application Specific Integrated Circuit), or a like.

What is claimed is:

1. A pulse generating circuit comprising:
   a first voltage outputting section comprising:
      a first delay circuit comprising a first resistor and a first capacitor and operating to output a first output voltage that changes from a first voltage towards a second voltage based on a first time constant according to a one-shot pulse; and
      a first transistor responsive to the one-shot pulse for allowing the first capacitor to charge to the first voltage within a charging time period less than a width of the one-shot pulse;
   a second voltage outputting section comprising:
      a second delay circuit comprising a second resistor and a second capacitor and operating to output a second output voltage that changes from said second voltage towards said first voltage based on a second time constant according to said one-shot pulse; and
      a second transistor responsive to the one-shot pulse for allowing the second capacitor to discharge to the second voltage within a discharging time period less than the width of the one-shot pulse; and
   a differential circuit to generate a pulse with a pulse width corresponding to a period from a time point of inputting said one-shot pulse to a cross time point when said first output voltage has the same value as said second output voltage.

2. The pulse generating circuit according to claim 1, wherein said differential circuit comprises an input stage which is made up of a first conductive type of MOS transistors and a current mirror circuit which is made up of a second conductive type of MOS transistors.

3. The pulse generating circuit according to claim 2, wherein threshold voltages of said first conductive type of MOS transistors are set to be equal to each other.

4. The pulse generating circuit according to claim 2, wherein said first conductive type of MOS transistors comprise n-channel MOS transistors, and a threshold voltage of each of said n-channel MOS transistors is 0 (zero) V or more and a cross-point voltage level or less, said cross-point voltage level being defined as a level of said first output voltage and said second output voltage at said cross time point.

5. The pulse generating circuit according to claim 2, wherein said first conductive type of MOS transistors comprise p-channel MOS transistors, and an absolute value of a threshold voltage of each of said p-channel MOS transistors is a cross-point voltage level or more, and a level of a source voltage or less, said cross-point voltage level being defined as a level of said first output voltage and said second output voltage at said cross time point; and
   wherein the source voltage is an input to the p-channel MOS transistors.

6. The pulse generating circuit according to claim 1, wherein said one-shot pulse is active high.

7. The pulse generating circuit according to claim 1, wherein said one-shot pulse is active low.

8. The pulse generating circuit according to claim 1, wherein said first time constant is equal to said second time constant.

9. A semiconductor device provided with a pulse generating circuit comprising:
   a first voltage outputting section comprising:
      a first delay circuit comprising a first resistor and a first capacitor and operating to output a first output voltage that changes from a first voltage towards a second voltage based on a first time constant according to a one-shot pulse; and
      a first transistor responsive to the one-shot pulse for allowing the first capacitor to charge to the first voltage within a charging time period less than a width of the one-shot pulse;
   a second voltage outputting section comprising:
      a second delay circuit comprising a second resistor and a second capacitor and operating to output a second output voltage that changes from said second voltage towards said first voltage based on a second time constant according to said one-shot pulse; and
      a second transistor responsive to the one-shot pulse for allowing the second capacitor to discharge to the second voltage within a discharging time period less than the width of the one-shot pulse; and
   a differential circuit to generate a pulse with a pulse width corresponding to a period from a time point of inputting said one-shot pulse to a cross time point when said first output voltage has the same value as said second output voltage.

10. The semiconductor device according to claim 9, wherein said differential circuit comprises an input stage which is made up of a first conductive type of MOS transistors and a current mirror circuit which is made up of a second conductive type of MOS transistors.

11. The semiconductor device according to claim 10, wherein threshold voltages of said first conductive type of MOS transistors are set to be equal to each other.

12. The semiconductor device according to claim 10, wherein said first conductive type of MOS transistors comprise n-channel MOS transistors, and a threshold voltage of each of said n-channel MOS transistors is 0 (zero) V or more and a cross-point voltage level or less, said cross-point voltage level being defined as a level of said first output voltage and said second output voltage at said cross time point.

13. The semiconductor device according to claim 10, wherein said first conductive type of MOS transistors comprise p-channel MOS transistors, and an absolute value of a threshold voltage of each of said p-channel MOS transistors is a cross-point voltage level or more, and a level of a source voltage or less, said cross-point voltage level being defined as a level of said first output voltage and said second output voltage at said cross time point; and
   wherein the source voltage is an input to the p-channel MOS transistors.

14. The pulse generating circuit according to claim 9, wherein said one-shot pulse is active high.

15. The pulse generating circuit according to claim 9, wherein said one-shot pulse is active low.

16. The pulse generating circuit according to claim 9, wherein said first time constant is equal to said second time constant.

* * * * *